(12) United States Patent
Lien et al.

(10) Patent No.: US 11,189,351 B2
(45) Date of Patent: Nov. 30, 2021

(54) PEAK AND AVERAGE CURRENT REDUCTION FOR SUB BLOCK MEMORY OPERATION

(71) Applicant: SanDisk Technologies LLC, Addison, TX (US)

(72) Inventors: Yu-Chung Lien, San Jose, CA (US); Sarath Puthenthermadam, San Jose, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 54 days.

(21) Appl. No.: 16/832,293

(22) Filed: Mar. 27, 2020

(65) Prior Publication Data

US 2021/0304822 A1 Sep. 30, 2021

(51) Int. Cl.
*G11C 11/34* (2006.01)
*G11C 16/26* (2006.01)
*G11C 16/04* (2006.01)
*H01L 27/11582* (2017.01)

(52) U.S. Cl.
CPC .......... *G11C 16/26* (2013.01); *G11C 16/0483* (2013.01); *H01L 27/11582* (2013.01)

(58) Field of Classification Search
CPC ................ G11C 16/26; G11C 16/0483; H01L 27/11582
USPC .................................................... 365/185.11
See application file for complete search history.

(56) References Cited

U.S. PATENT DOCUMENTS

| | | | | |
|---|---|---|---|---|
| 9,355,724 B2* | 5/2016 | Oh | ........................ | G11C 16/26 |
| 9,715,937 B1* | 7/2017 | Pang | .................... | G11C 11/5642 |
| 9,952,944 B1* | 4/2018 | Alrod | ................. | G11C 16/3459 |
| 10,249,372 B2* | 4/2019 | Chen | ...................... | G11C 16/08 |
| 10,541,035 B1* | 1/2020 | Lu | ....................... | G11C 16/0483 |
| 10,636,501 B1* | 4/2020 | Chen | .................... | G11C 11/5642 |
| 10,902,925 B1* | 1/2021 | Lien | ..................... | G11C 16/0483 |
| 11,004,525 B1* | 5/2021 | Gautam | ............... | G11C 29/021 |
| 11,031,089 B2* | 6/2021 | Singidi | ................. | G11C 16/26 |

(Continued)

FOREIGN PATENT DOCUMENTS

| | | | |
|---|---|---|---|
| JP | 2007087526 A | | 4/2007 |
| JP | 2016177860 A | | 10/2016 |

(Continued)

*Primary Examiner* — Viet Q Nguyen
(74) *Attorney, Agent, or Firm* — Dickinson Wright PLLC; Steven Hurles

(57) ABSTRACT

A memory apparatus and method of operation is provided. The apparatus includes a block of memory cells arranged in strings and connected to word lines overlying one another in a stack. The block is divided into first and second sub-blocks programmed as a whole in a sub-block mode and includes a particular group connected to a particular word line. A control circuit determines whether the particular group being read is in the second sub-block when operating in the sub-block mode. The control circuit also determines whether one of the first and second sub-blocks is not programmed based on whether the particular group being read is in the second sub-block. The control circuit applies an adjusted read voltage to the word lines of the one of the first and second sub-blocks while reading the particular group based on whether the one of the first and second sub-blocks is not programmed.

20 Claims, 20 Drawing Sheets

(56) References Cited

U.S. PATENT DOCUMENTS

| | | | |
|---|---|---|---|
| 11,049,582 B1* | 6/2021 | Parthasarathy | ........ G11C 29/46 |
| 2009/0238003 A1 | 9/2009 | Namiki et al. | |
| 2014/0136765 A1 | 5/2014 | Oh et al. | |
| 2017/0084340 A1* | 3/2017 | Lee | ......................... G11C 16/26 |
| 2020/0105353 A1* | 4/2020 | Sharon | ................... G11C 16/28 |

FOREIGN PATENT DOCUMENTS

| | | |
|---|---|---|
| JP | 2017054571 A | 3/2017 |
| KR | 20130042780 A | 4/2013 |
| KR | 20170033661 A | 3/2017 |
| KR | 20180048709 A | 5/2018 |
| KR | 20180102000 A | 9/2018 |
| KR | 20190130263 A | 11/2019 |

\* cited by examiner

PEAK AND AVERAGE CURRENT REDUCTION FOR SUB BLOCK MEMORY OPERATION

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory apparatus includes memory cells which may be arranged in strings, for instance, where select gate transistors are provided at the ends of the string to selectively connect a channel of the string to a source line or bit line. However, various challenges are presented in operating such memory devices. Accordingly, there is still a need for improved memory apparatuses.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a block of memory cells arranged in strings and connected to word lines overlying one another in a stack. The block is divided into a first sub-block and a second sub-block configured to be programmed as a whole in a sub-block mode. The block also includes a particular group connected to a particular word line. The apparatus includes a control circuit coupled to the word lines and configured to determine whether the particular group being read are in the second sub-block in response to the apparatus operating in the sub-block mode. The control circuit is also configured to determine whether one of the first sub-block and the second sub-block is not programmed based on whether the particular group being read are in the second sub-block. The control circuit is additionally configured to apply an adjusted read voltage to the word lines of the one of the first sub-block and the second sub-block while reading the particular group based on whether the one of the first sub-block and the second sub-block is not programmed.

According to another aspect of the disclosure a controller in communication with a block of memory cells of a memory apparatus arranged in strings and connected to word lines overlying one another in a stack is provided. The block of the memory apparatus is divided into a first sub-block and a second sub-block configured to be programmed as a whole in a sub-block mode. The block also includes a particular group connected to a particular word line. The controller is configured to determine whether the particular group being read are in the second sub-block in response to the apparatus operating in the sub-block mode. The controller is also configured to instruct the memory apparatus to determine whether one of the first sub-block and the second sub-block is not programmed based on whether the particular group being read are in the second sub-block. In addition, the controller is configured to instruct the memory apparatus to apply an adjusted read voltage to the word lines of the one of the first sub-block and the second sub-block while reading the particular group based on whether the one of the first sub-block and the second sub-block is not programmed.

According to an additional aspect of the disclosure, a method of operating a memory apparatus including a block of memory cells arranged in strings and connected to word lines overlying one another in a stack is provided as well. The block the memory apparatus is divided into a first sub-block and a second sub-block configured to be programmed as a whole in a sub-block mode. The block also includes a particular group connected to a particular word line. The method includes the step of determining whether the particular group being read are in the second sub-block in response to the apparatus operating in the sub-block mode. The next step of the method is determining whether one of the first sub-block and the second sub-block is not programmed based on whether the particular group being read are in the second sub-block. The method continues with the step of applying an adjusted read voltage to the word lines of the one of the first sub-block and the second sub-block while reading the particular group based on whether the one of the first sub-block and the second sub-block is not programmed.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Figure 1:
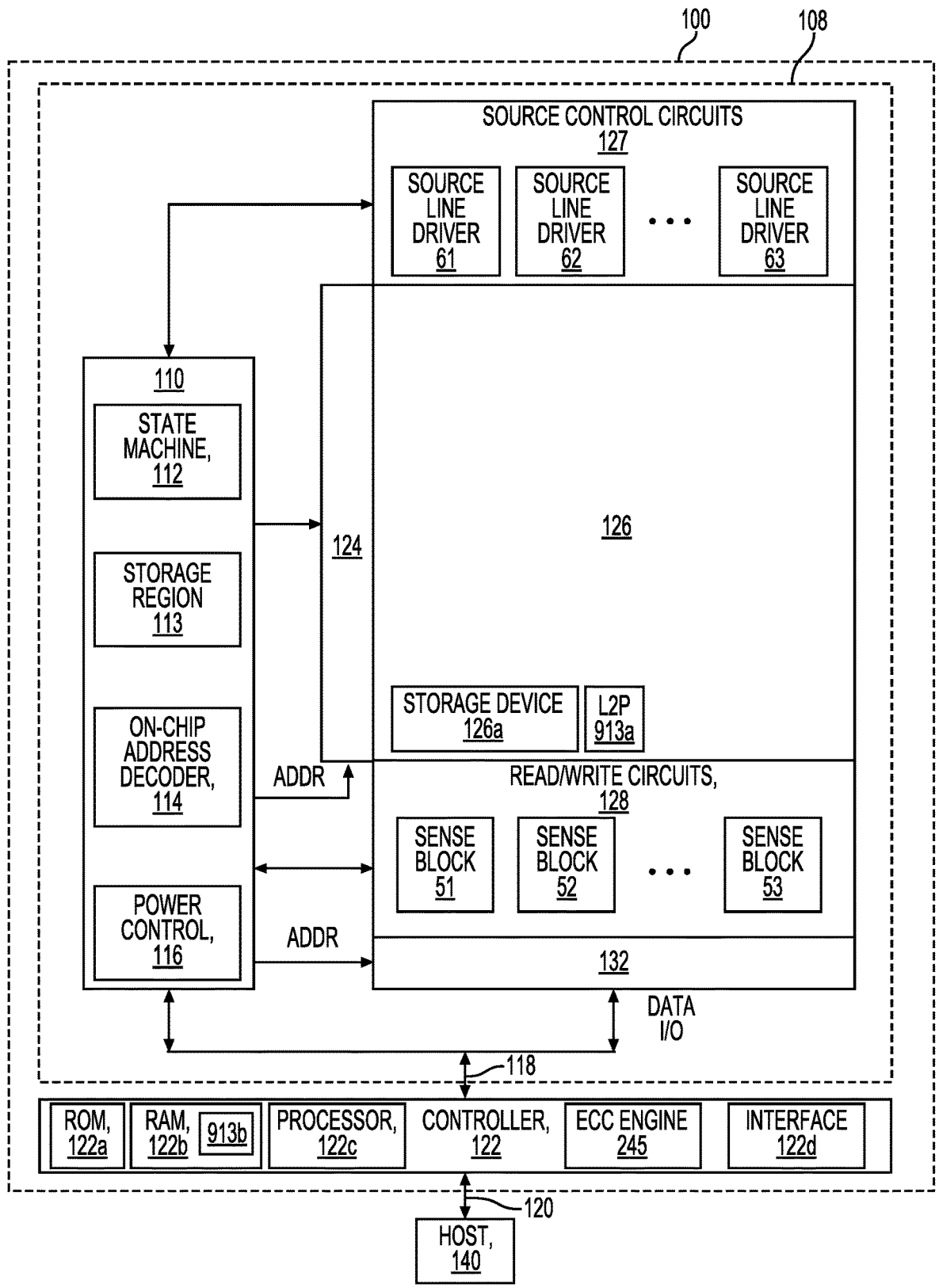
FIG. 1 is a block diagram of an example memory apparatus according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

As memory apparatus increase in capacity, the quantity or number of word lines and the amount of data that can be stored per block may increase. Yet, with larger block sizes, block yield, block budget, data allocation efficiency and speed, garbage collection may all be adversely affected. Consequently, sub-block mode operation may be implemented to allow a user to program only one sub-block at a time. Thus, advantages for sub-block mode operation may be realized, such as improved data handling due to the ability to erase sub-blocks instead of the whole block. Additionally, block yield can be improved as a whole block is not abandoned due to a single poor or deteriorated word line. So, the memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8B). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage (Vth) of the memory cell exceeds the read voltage. The read voltages are set at levels which are expected to be between the threshold voltage levels of adjacent data states.

Electrical current is consumed throughout the operation of the memory device or apparatus, including programming and reading operations, for example. Increased average current draw (Icc) for the memory apparatus can unfavorably impact battery life of a mobile device utilizing the memory apparatus. Thus, both a smaller average current draw (Icc) and current draw (Icc) peak are desirable. It is observed that both the current draw peak and average current draw increase when the block is not fully programmed (i.e., open block). Such open block operation can result from the memory apparatus programming several dies with usage of few word lines to determine program performance, for example. Similarly, because with sub-block programming, whole sub-blocks may be erased or programmed at a time, there may be instances in which some of the block is programmed while the remainder is not programmed. Thus, sub-block operation can also lead to increased average current draw (Icc) and current draw (Icc) peak.

FIG. 1 is a block diagram of an example memory device. The memory device 100, such as a non-volatile storage apparatus, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

In one approach, control circuitry 110 is also in communication with source control circuits 127, which includes source line driver 61, source line driver 62, . . . , source line circuit 63. The source line drivers are used to drive different (or the same) voltages on individual source lines.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein.

For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine 245 can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. The control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements or cells may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements or cells located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements or cells are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements or cells may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
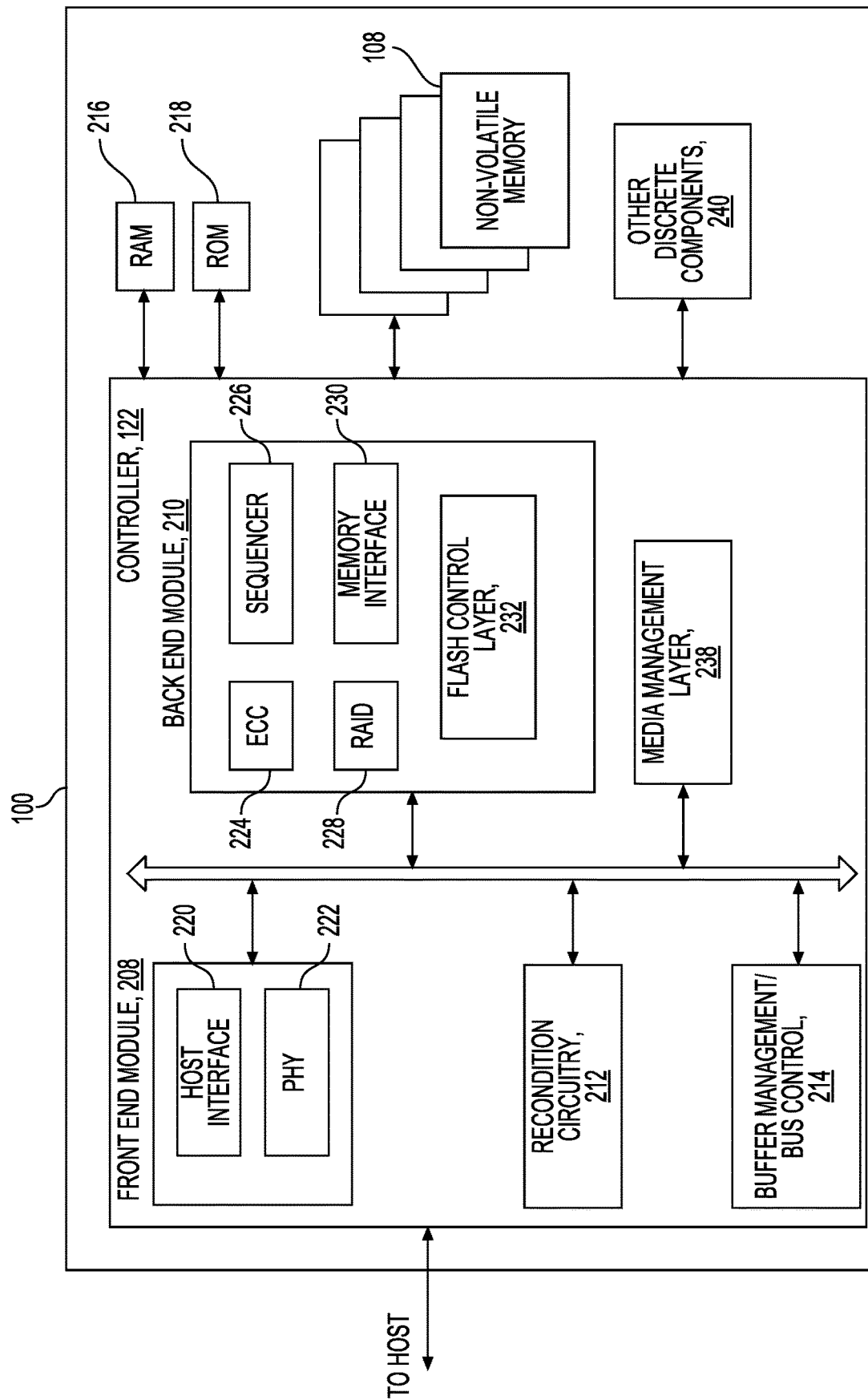
FIG. 2 is a block diagram of the example memory apparatus, depicting additional details of a controller according to aspects of the disclosure.

FIG. 2 is a block diagram of the example memory device or apparatus 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device or apparatus 100 include media management layer 238, which performs wear leveling of memory cells of non-volatile memory die 108. The memory system also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In in one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
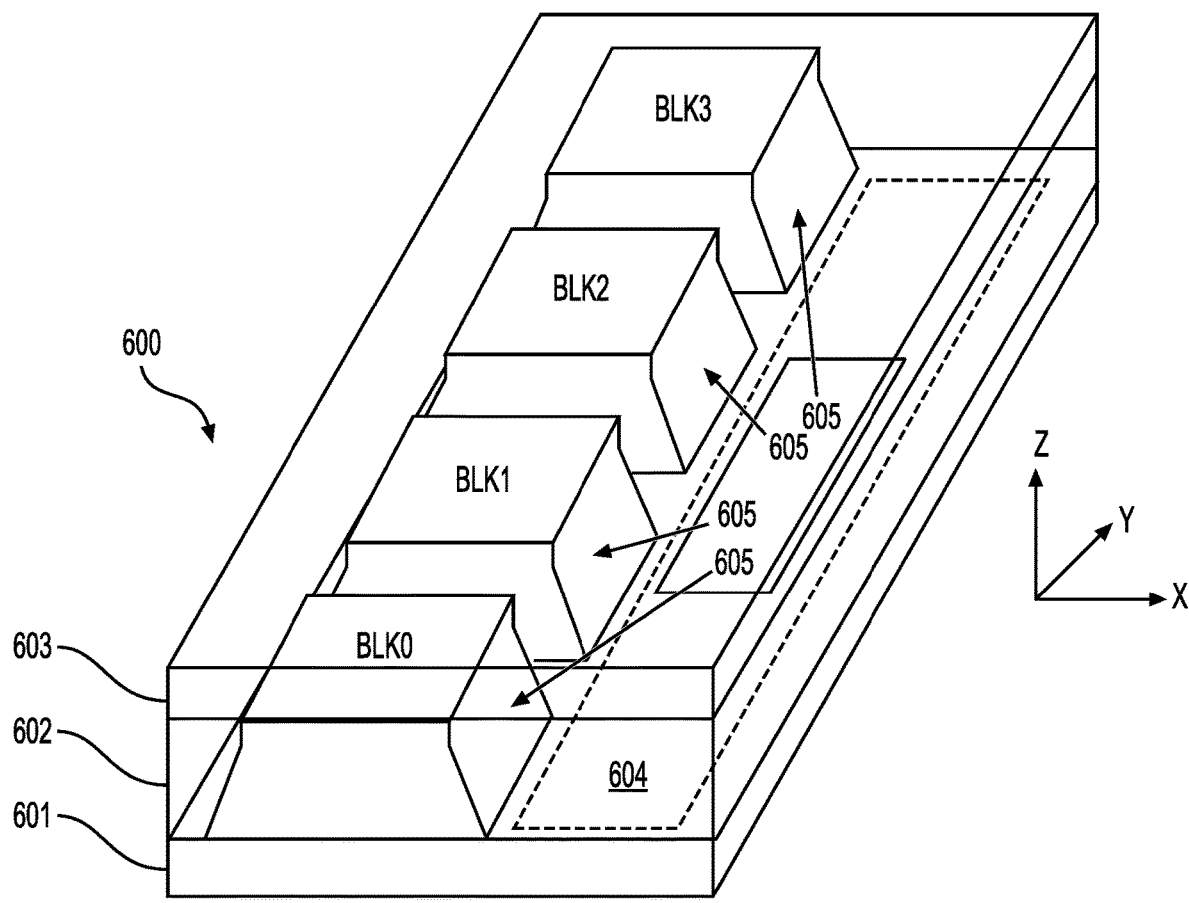
FIG. 3 is a perspective view of another memory apparatus comprising a set of blocks in an example 3D configuration of a memory structure of the example memory apparatus of FIG. 1 according to aspects of the disclosure.

FIG. 3 is a perspective view of a memory device or apparatus 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
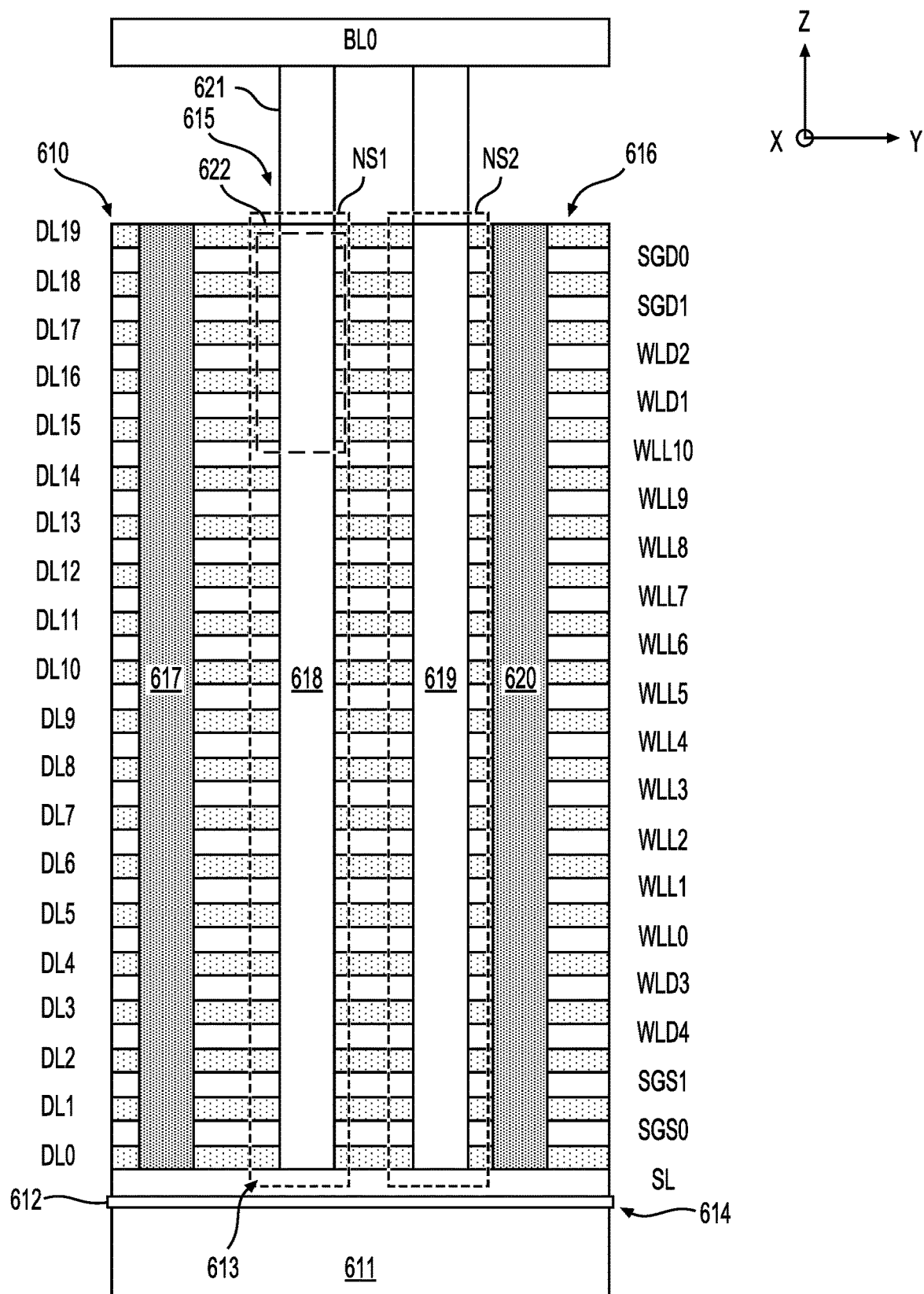
FIG. 4 depicts an example cross-sectional view of a portion of one of the blocks of FIG. 3 according to aspects of the disclosure.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack 610 includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 5:
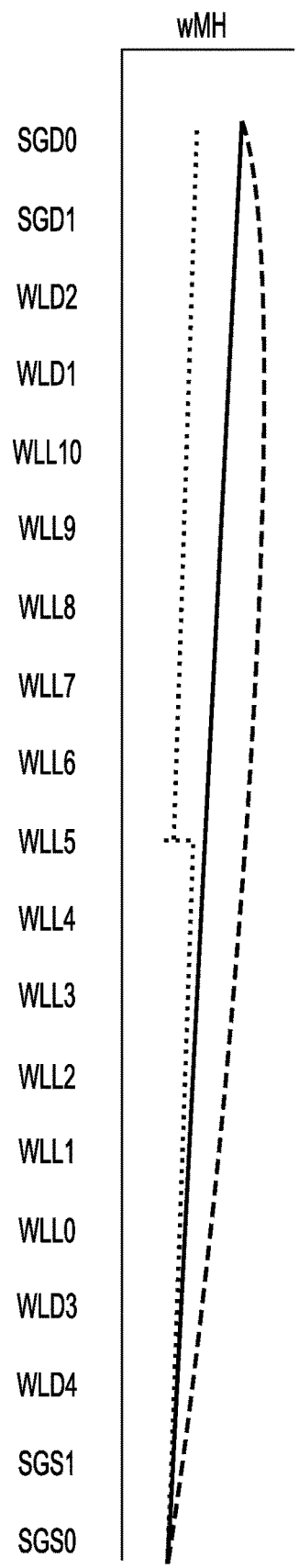
FIG. 5 depicts a plot of memory hole diameter in the stack of FIG. 4 according to aspects of the disclosure.

FIG. 5 depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes.

Figure 12A:
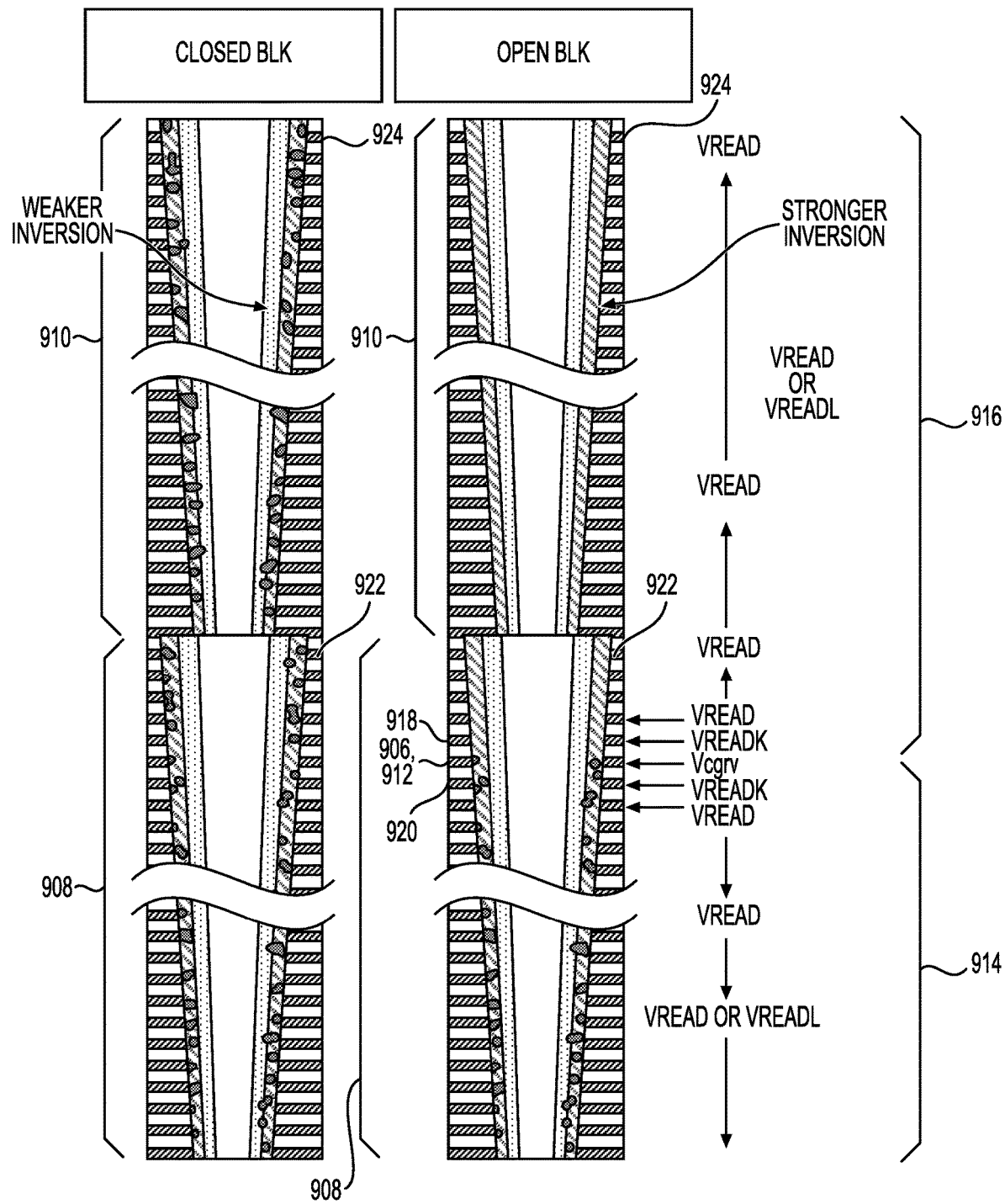
FIG. 12A shows an example arrangement of two tiers of the memory apparatus according to aspects of the disclosure.

In another possible implementation, represented by the short dashed line, the stack is fabricated in two tiers (also shown in FIG. 12A). The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
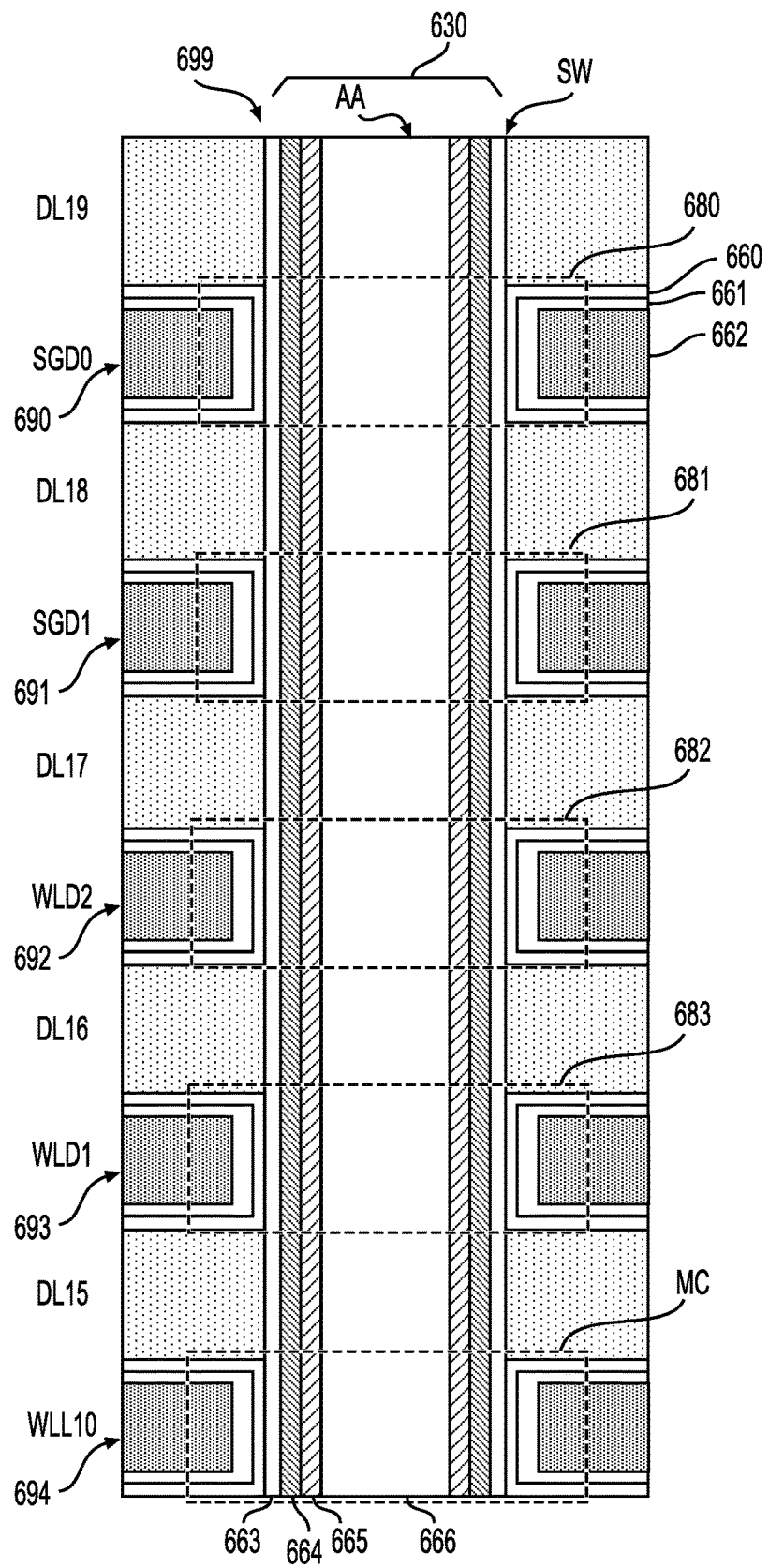
FIG. 6 depicts a close-up view of a region of the stack of FIG. 4 according to aspects of the disclosure.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
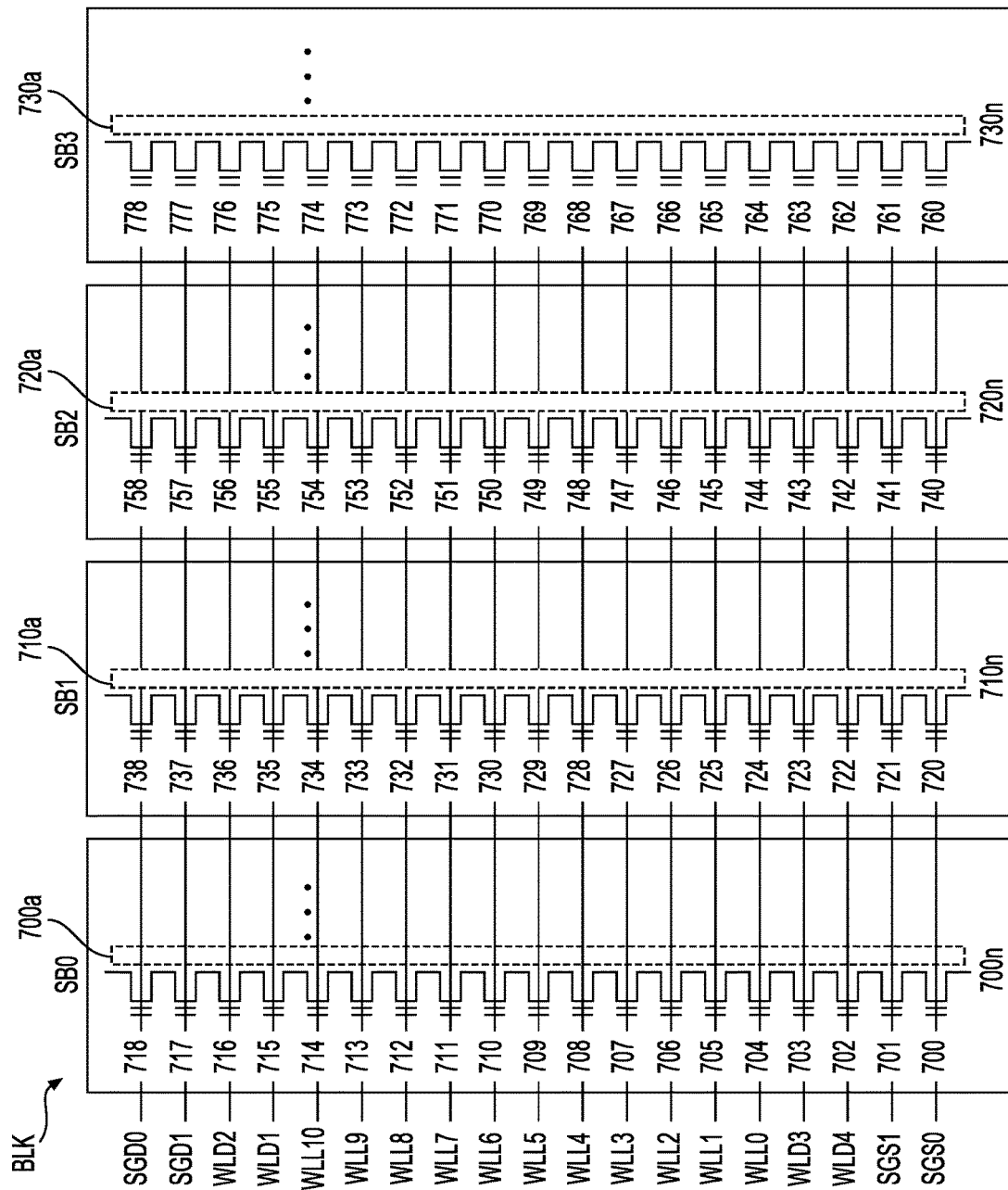
FIG. 7A depicts an example view of NAND strings in sub-blocks in a 3D configuration which is consistent with FIG. 4 according to aspects of the disclosure.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WLL0, the source-side word line and proceeding one word line at a time to WLL10, the drain-side word line.

The NAND strings 700n, 710n, 720n and 730n have channels 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final threshold voltage (Vth) distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 7B:
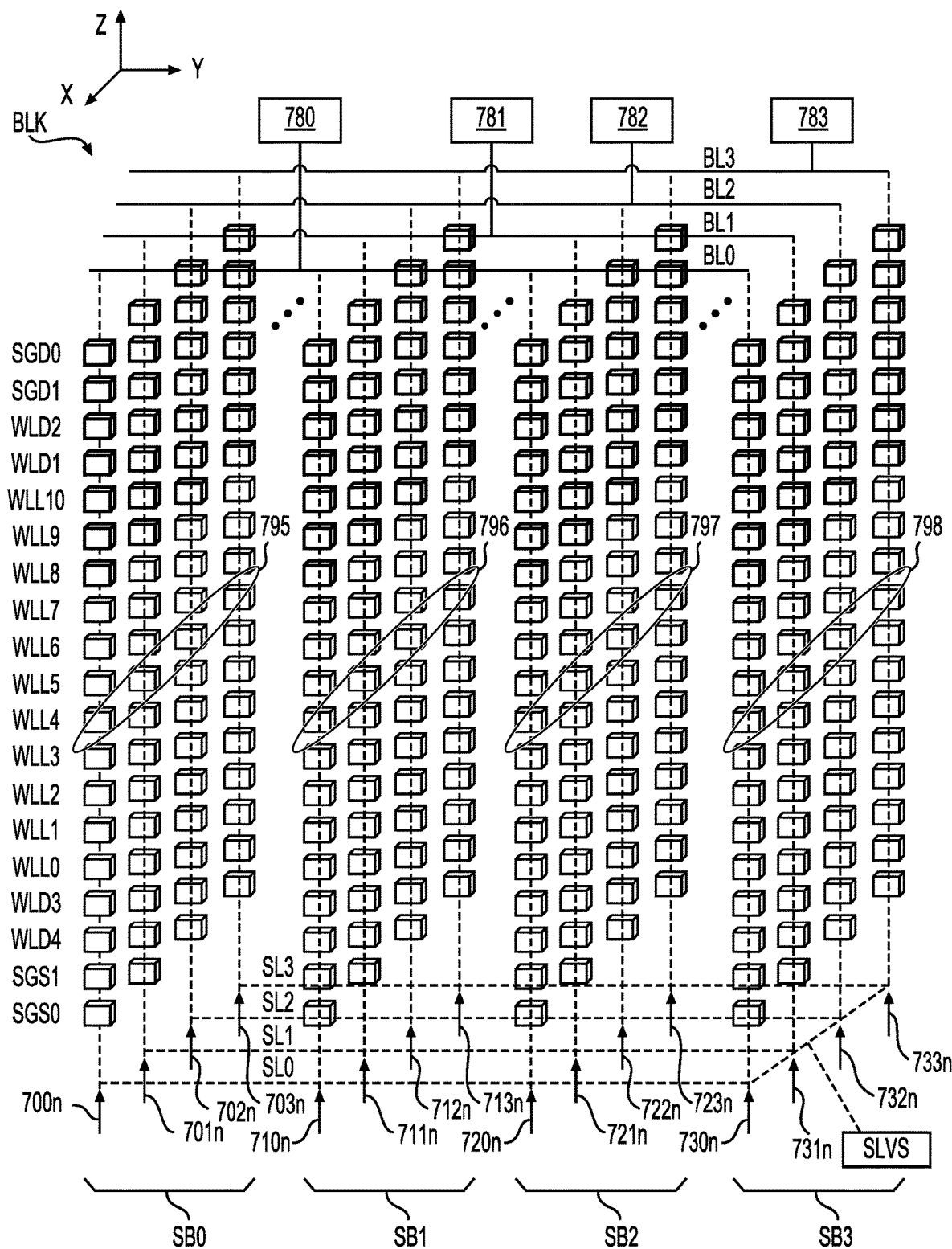
FIG. 7B depicts additional detail of the sub-blocks of FIG. 7A according to aspects of the disclosure.

FIG. 7B depicts additional detail of the sub-blocks SB0-SB3 of FIG. 7A. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712 n and 713n SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4. In this example, the source lines SL0-SL3 are connected and driven at a common voltage by a voltage source, SLVS.

In another possible implementation, the source lines are separate and can be driven at respective voltages.

Figure 7C:
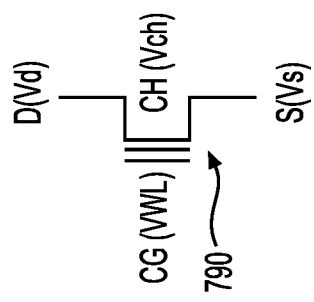
FIG. 7C depicts an example memory cell according to aspects of the disclosure.

FIG. 7C depicts an example memory cell 790. The memory cell comprises a control gate CG which receives a word line voltage Vwl, a drain at a voltage Vd, a source at a voltage Vs and a channel at a voltage Vch. During programming, the cell has a positive control gate-to-channel voltage which draws electrons into the charge trapping layer. During erase, the cell has a positive channel-to-gate voltage which repels electrons from the charge trapping layer.

Figure 8:
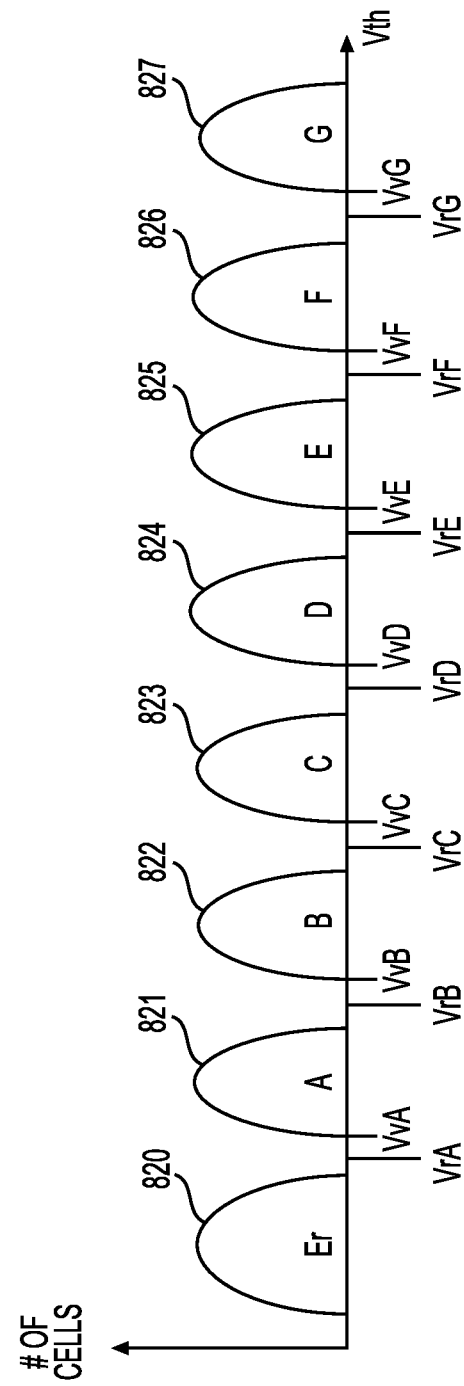
FIG. 8 depicts an example threshold voltage distribution of memory cells, where eight data states are used according to aspects of the disclosure.

FIG. 8 depicts an example Vth distribution of memory cells, where eight data states are used. The Er, A, B, C, D, E, F and G states have Vth distributions 820, 821, 822, 823, 824, 825, 826 and 827, respectively. For the A, B, C, D, E, F and G states, we have verify voltages VvA, VvB, VvC, VvD, VvE, VvF and VvG, respectively, and read voltages VrA, VrB, VrC, VrD, VrE, VrF and VrG, respectively, and example encoding of bits of 111, 110, 100, 000, 010, 011, 001 and 101, respectively. The bit format is: UP/MP/LP.

In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG.

As previously discussed, increased average current draw (Icc) for the memory apparatus can adversely affect battery life of a mobile device utilizing the memory apparatus 100, 600. Thus, a smaller average current draw leads to more sustainable operation for the mobile device. However, current draw peak is equivalently important. If the current draw peak exceeds the system's spec, the power supply will be quenched and the memory apparatus will not work. In addition, sub-block mode operation may be implemented to allow a user to program only one sub-block at a time as memory apparatus increase in capacity.

Figure 9:
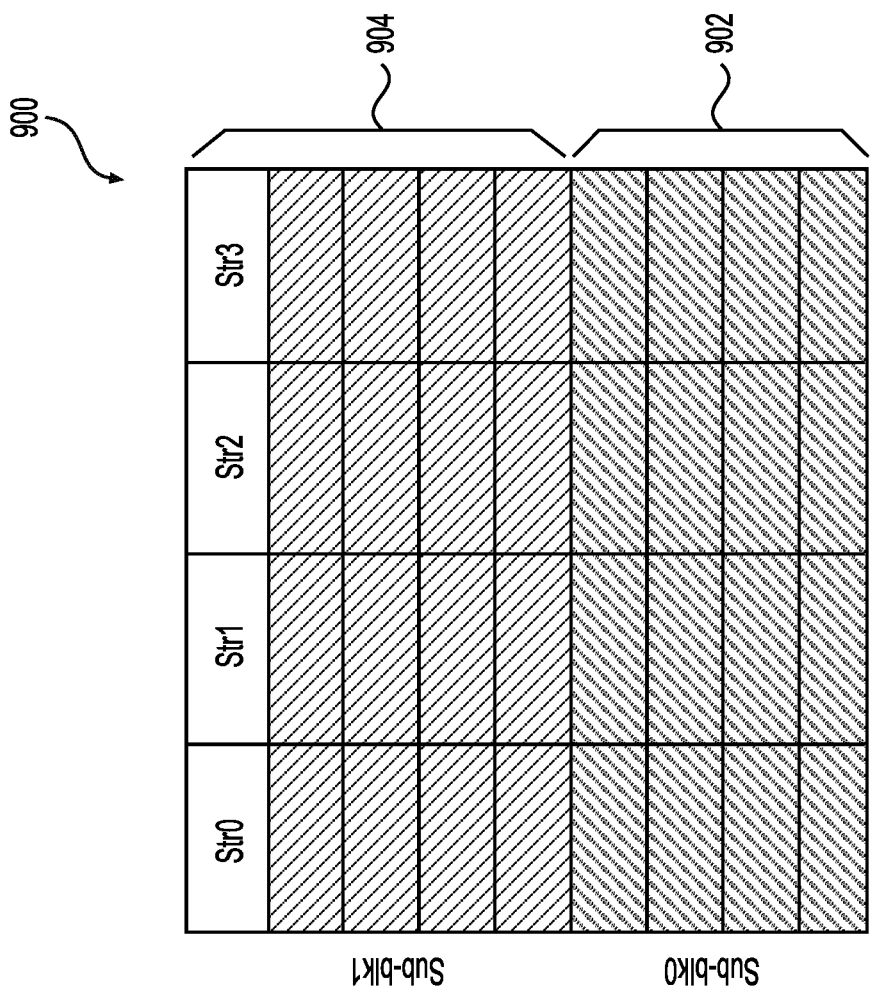
FIG. 9 shows a block divided into a first sub-block and a second sub-block configured to be programmed as a whole in a sub-block mode according to aspects of the disclosure.

Instead of partitioning sub blocks as shown in FIGS. 7A and 7B, a block 900 of memory cells arranged in strings and connected to word lines overlying one another in a stack can be arranged as shown in FIG. 9 (i.e., a word line based sub-block approach rather than a string based sub-block approach). As illustrated, the block 900 is divided into a first sub-block 902 and a second sub-block 904 configured to be programmed as a whole in a sub-block mode. So, the sub-block mode allows user to program the first sub-block 902 (sub-blk0) or the second sub-block 904 (sub-blk1) separately. While only two sub-blocks 902, 904 are illustrated, it should be appreciated that any number of sub-blocks may be utilized.

Figure 10A:
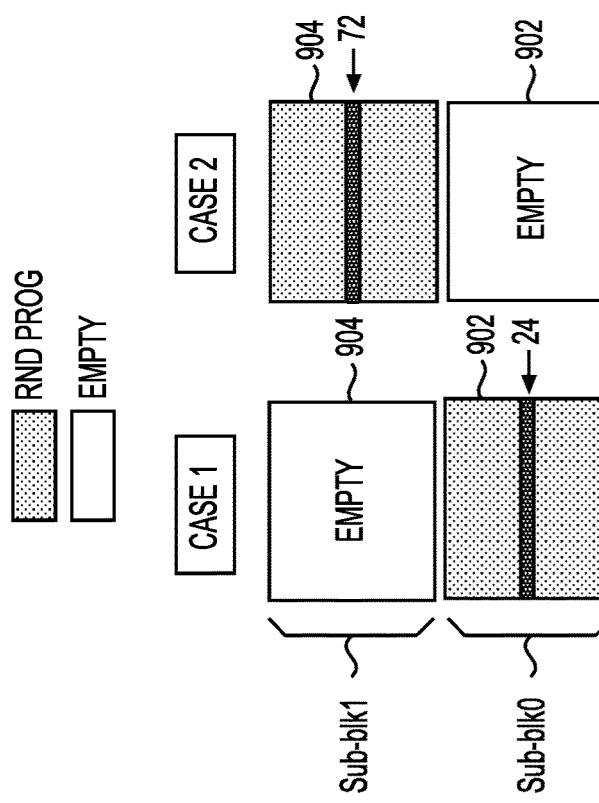
FIG. 10A illustrates the first sub-block of an example memory apparatus being programmed while the second sub-block is empty in a first case and the second sub-block of the example memory apparatus being programmed while the first sub-block is empty in a second case according to aspects of the disclosure.
Figure 10B:
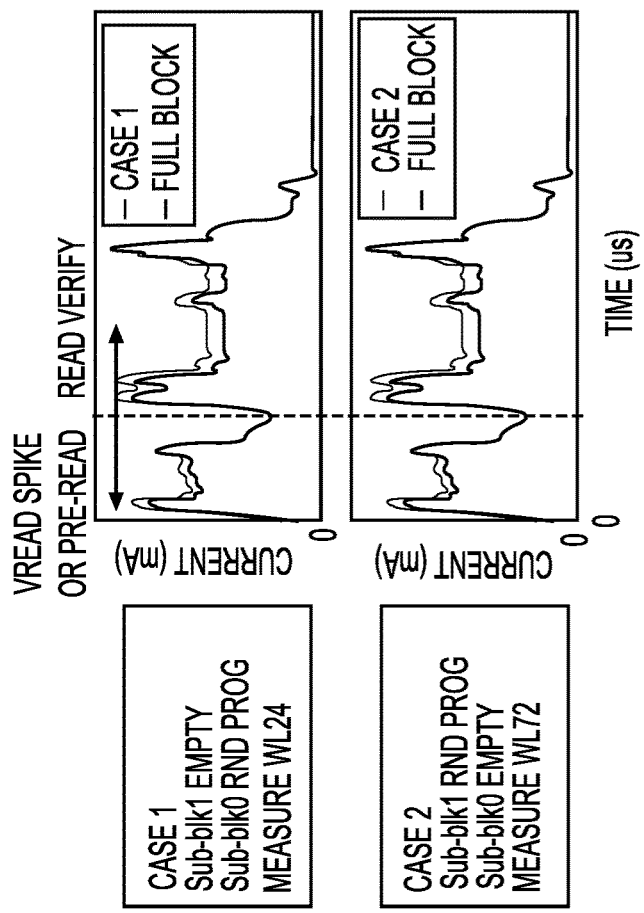
FIG. 10B shows current draw of the example memory apparatus during a read operation in the first case and another word line in the second case as compared to full block conditions according to aspects of the disclosure.

Open block is a common situation during the operation of the memory apparatus 100, 600. It is observed that both peak Icc and average Icc increase when the block 900 is not fully programmed (i.e., open block), during a read of the memory apparatus 100, 600 for example. Similarly, for sub-block operation both peak Icc and average Icc increase also increase when one of a plurality of sub-blocks 902, 904 is not programmed. In some scenarios, a read operation may be performed when only the first sub-block 902 (sub-blk0) or the second sub-block 904 (sub-blk1) is programmed. As best shown in FIG. 10A, in a first case (i.e., case 1), the first sub-block 902 of an example memory apparatus 100, 600 is programmed while the second sub-block 904 is empty (i.e., not programmed). In a second case (i.e., case 2), the second sub-block 904 of the example memory apparatus 100, 600 is programmed while the first sub-block 902 is empty (i.e., not programmed). FIG. 10B shows current draw of the example memory apparatus 100, 600 during a read operation of word line 24 in the first case, and word line 72 in the second case as compared to full block conditions. The read operation includes both a read pass voltage spike (i.e., pre-read or VREAD spike) that cleans residual electrons in the channel or memory hole and a read verify phase that follows the VREAD spike. As shown, both the peak current draw and average current draw are higher for the first and second cases than for the full block conditions. Specifically, it is observed that peak current draw and average current draw are higher primarily during the read verify phase.

Figure 11:
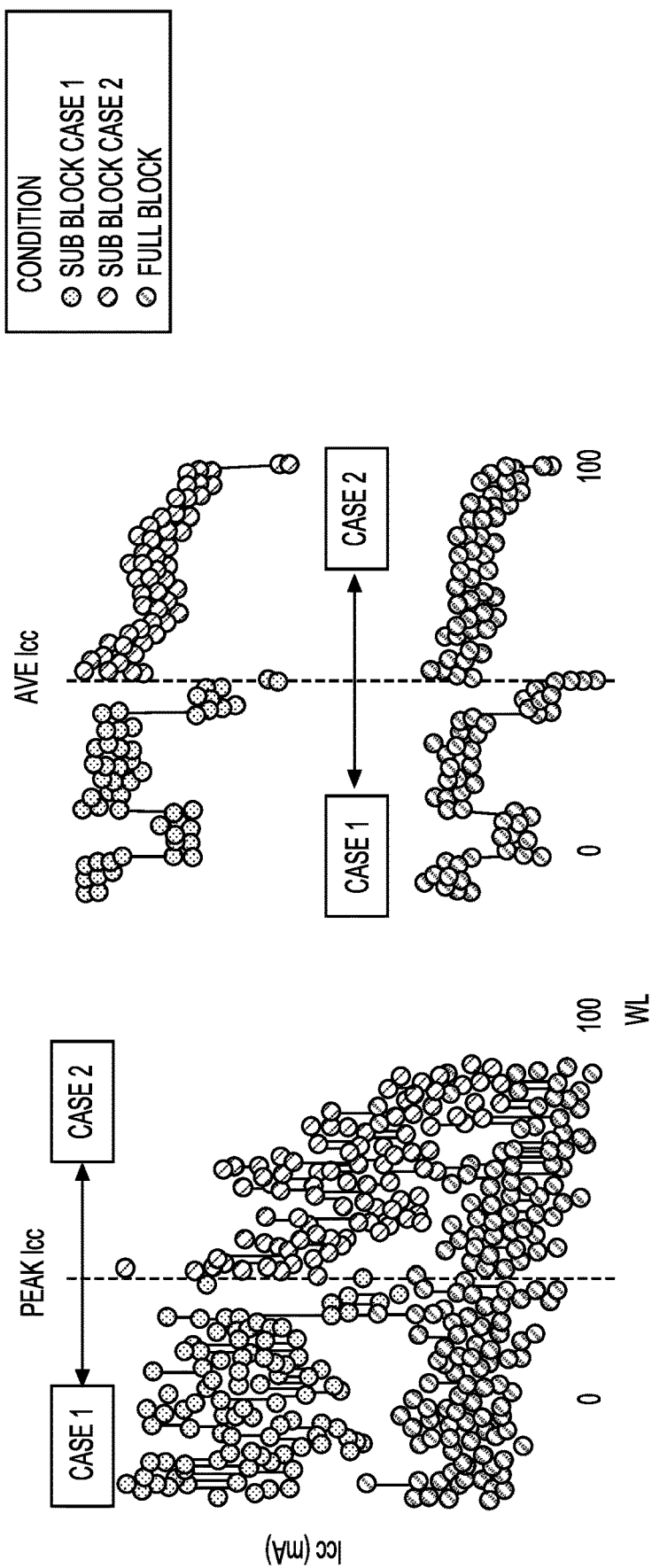
FIG. 11 shows word line dependency of the current draw peak and average current draw for the first case, second case and full block conditions according to aspects of the disclosure.

FIG. 11 shows the word line dependency of the current draw peak and average current draw for the first case (sub-block case 1), second case (sub-block case 2) and full block conditions with the word line indicated as first (e.g., WL0) being closest to the substrate 611 (FIG. 4) and the last (e.g., WL100) being furthest from the substrate 611. A weak trend for peak current draw versus increasing word line number (increasing number further from the substrate 611 in the z direction of FIG. 4) is observed. As shown, measurement or reading in the sub-block mode boosts the peak current draw and average current draw approximately 3.6-7% and 7.4-8.2% respectively.

Figure 12B:
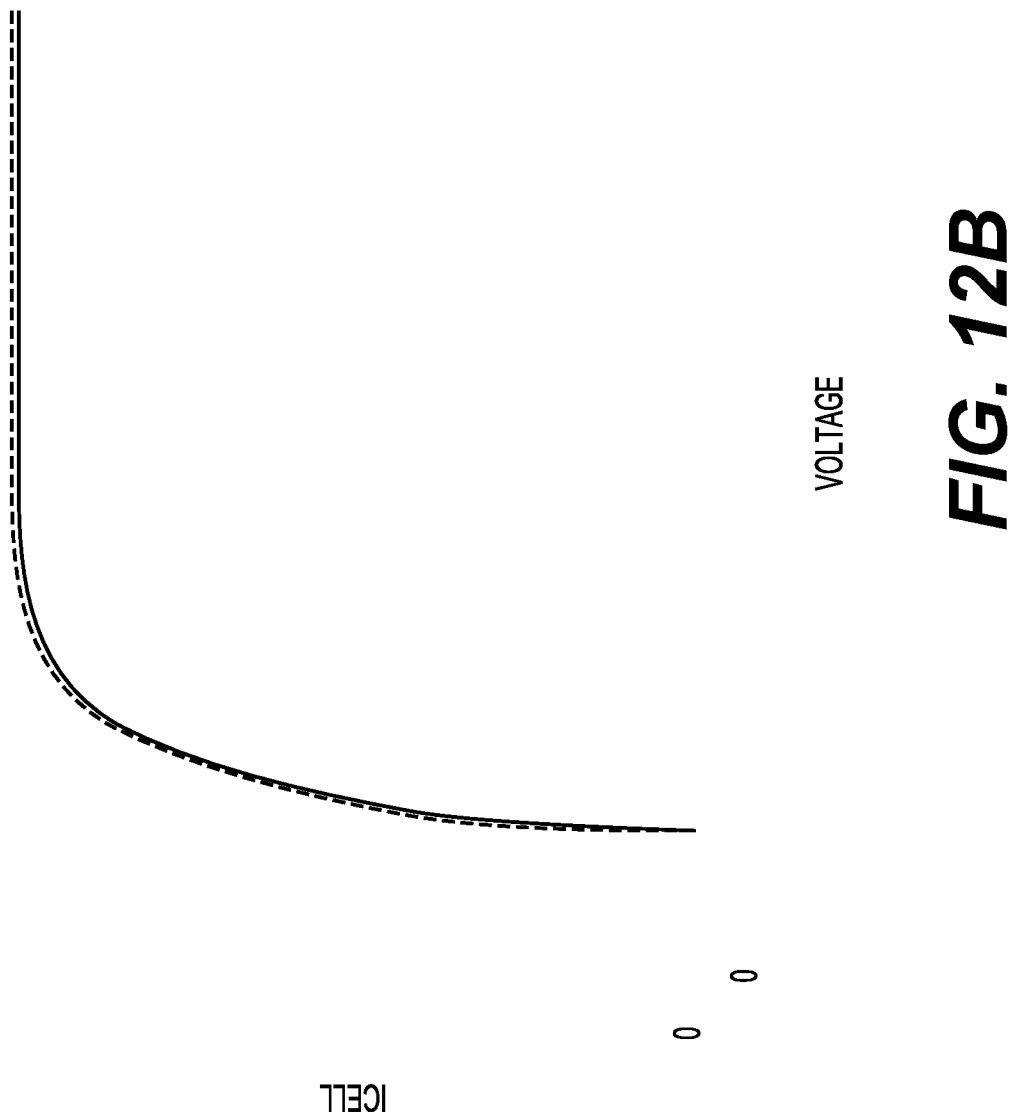
FIG. 12B illustrates a higher current draw resulting from a channel above WLn+2 exhibiting stronger channel inversion compared to the closed block condition according to aspects of the disclosure.

FIG. 12A shows an example arrangement of two tiers of the memory apparatus 100, 600. As discussed, the apparatus 100, 600 includes the block 900 of memory cells arranged in strings and connected to word lines overlying one another in the stack. The memory cells of the apparatus 100, 600 include a particular group of memory cells connected to a particular word line 906 (e.g., the word line being read at any given time). The apparatus 100, 600 also includes the control circuit (e.g., control circuitry 110 and the controller 122) coupled to the word lines. The biasing voltage for the lower memory hole (MH) in a lower tier 908 can be either the default read pass voltage (VREAD) or a lower read pass voltage (VREADL) and the border of application of the VREADL voltage can be determined by the control circuit (e.g., using LAY_READ_EN). VREADL is smaller than the default read pass voltage (VREAD) and helps to compensate for the physical shape of the memory hole. However, despite the VREADL or VREAD setting, the current draw peak and average current draw may be larger for a half programmed sub-block condition (i.e., only one of the sub-blocks 902, 904 being programmed and the other being empty or not programmed) as compared to the full block condition (i.e., both sub-blocks 902, 904 programed) on the same word line. The same VREAD bias (VREADL or VREAD) is applied to word lines other than the particular word line 906 plus an offset number of word lines (e.g., WLn+2, the offset being two). If it is the half programmed sub-block condition, the empty tier 908, 910 or sub-block 902, 904 exhibits stronger channel inversion comparing to closed or full block condition and leads to higher current draw (Icc), as shown in FIG. 12B. While the particular word line 906 and a boundary word line 912 (word line between programmed memory cells and memory cells that are not programmed) are shown as being the same word line in FIG. 12A, it should be appreciated that they may also be separate word lines.

Thus, in order to help reduce the peak and average current draw (Icc), the control circuit (e.g., control circuitry 110 and the controller 122) is configured to determine whether the particular group being read are in the second sub-block 904 in response to the apparatus operating in the sub-block mode. So, when the apparatus 100, 600 receives a read command, it determines if it is a sub-block mode read operation. The control circuit is also configured to determine whether one of the first sub-block 902 and the second sub-block 904 is not programmed based on whether the particular group being read are in the second sub-block 904. The control circuit applies an adjusted read voltage (e.g., smaller VREAD) to the word lines of the one of the first sub-block 902 and the second sub-block 904 while reading the particular group (i.e., memory cells connected to the particular word line 906) based on whether the one of the first sub-block 902 and the second sub-block 904 is not programmed. According to an aspect, the adjusted read voltage is less than the default read pass voltage (VREAD).

In more detail, the control circuit is configured to determine whether the first sub-block 902 of memory cells is not programmed in response determining the particular group being read are in the second sub-block 904. The control circuit is also configured to apply the adjusted read voltage (e.g., smaller VREAD) to word lines of the first sub-block 902 in response to determining the first sub-block 902 of memory cells is not programmed. The control circuit additionally applies a read voltage (Vcgrv) to the particular word line 906 and the default read pass voltage (VREAD) to the word lines of the second sub-block 904 while reading the particular group of memory cells.

However, if instead of being empty, the first sub-block 902 is programmed, the control circuit will execute the read operation, but without applying the adjusted read voltage (e.g., smaller VREAD) to word lines of the first sub-block 902. Thus, the control circuit is additionally configured to apply the default read pass voltage (VREAD) to the word lines of the first sub-block 902 in response to determining the first sub-block 902 of memory cells is programmed. The control circuit also applies the default read pass voltage (VREAD) to the word lines of the second sub-block 904 in response to determining the first sub-block 902 of memory cells is programmed. In addition, the control circuit is configured to apply the read voltage (Vcgrv) to the particular word line 906 while reading the particular group of memory cells.

The control circuit is also configured to determine whether the second sub-block 904 of memory cells is not programmed in response determining the particular group being read is not in the second sub-block 904. The control circuit is also configured to apply the adjusted read voltage (e.g., smaller VREAD) to word lines of the second sub-block 904 in response to determining the second sub-block 904 of memory cells is not programmed. In addition, the control circuit is configured to apply the read voltage (Vcgrv) to the particular word line 906 and the default read pass voltage (VREAD) to the word lines of the first sub-block 902 while reading the particular group of memory cells.

Though, if instead of being empty, the second sub-block 904 is programmed, the control circuit will execute the read operation, but without applying the adjusted read voltage (i.e., smaller VREAD) to word lines of the second sub-block 904. Therefore, the control circuit is configured to apply the default read pass voltage (VREAD) to the word lines of the second sub-block 904 in response to determining the second sub-block 904 of memory cells is programmed. The control circuit is also configured to apply the default read pass voltage (VREAD) to the word lines of the second sub-block 904 in response to determining the second sub-block 904 of memory cells is programmed. The control circuit additionally applies the read voltage (Vcgrv) to the particular word line 906 while reading the particular group of memory cells.

The word lines also include at least one first neighbor word line 918 adjacent to the particular word line 906 in the stack and at least one second neighbor word line 920 also adjacent to the particular word line 906 in the stack. Although only one of each of the at least one first and second neighbor word lines 918, 920 are shown in FIG. 12A, other quantities of the at least one first and second neighbor word lines 918, 920 are contemplated. The control circuit also applies a neighbor word line voltage (VREADK) being higher than the default read pass voltage (VREAD) to each of the at least one first and second neighbor word lines 918, 920 while reading the particular group of memory cells.

As mentioned above, the control circuit is configured to determine whether the first sub-block 902 and/or the second sub-block 904 are programmed or empty (i.e., not programmed). So, according to an aspect, the apparatus 100, 600 includes a logical to physical (L2P) table 913a (FIG. 1) stored in the memory cells (e.g., memory structure 126) and a temporary L2P table 913b (FIG. 1) stored in random access memory (e.g., RAM 122b). Both of the L2P table 913a and the temporary L2P table 913b are configured to store information regarding which blocks 900 and/or sub-blocks 902, 904 of the apparatus 100, 600 are used (i.e., programmed) or empty (i.e., not programmed). Entries in the L2P table 913a can for instance contain physical addresses for logical memory pages. Entries in L2P table 913a may also contain additional information about pages of the memory cells of the apparatus 100, 600. So, each time that the apparatus 100, 600 opens a new block 900 for use, the control circuit is configured to write information into the memory cells, for example in the temporary L2P table 913b, to ensure that whatever data is stored in the new block 900 can be located at a later time. If the control circuit receives an indication that a power cycle of the apparatus 100, 600 is planned, the control circuit will dump all of the information from the temporary L2P table 913b in RAM into the memory cells to retain it there during the power cycle. If the power cycle is a sudden power off, some of the information regarding which blocks 900 and/or sub-blocks 902, 904 of the apparatus 100, 600 are used may be lost. Thus, the control circuit is configured to recover such information (e.g., by performing searches on the open blocks 900 using the L2P table 913a stored in the memory cells). Consequently, the control circuit is configured to determine whether the first sub-block 902 is not programmed using at least one of the L2P table 913a and the temporary L2P table 913b. The control circuit is also configured to determine whether the second sub-block 904 is not programmed using at least one of the L2P table 913a and the temporary L2P table 913b.

The operation above has been discussed for the case in which the memory apparatus 100, 600 is operating in the sub-block mode; however, the control circuit may instead determine that the apparatus 100, 600 is not operating in the sub-block mode. Operation of the apparatus 100, 600 in a mode other than the sub-block mode can be carried out as set forth in U.S. patent application Ser. No. 16/688,587, titled "Peak and Average Current Reduction for Open Block Condition" filed Nov. 19, 2019 and incorporated by reference herein. Generally, in response to the apparatus 100, 600 not operating in the sub-block mode, the control circuit is configured to determine whether the memory cells of the block 900 are all programmed. The control circuit is also configured to determine the boundary word line 912 splitting the word lines into a first word line set 914 connected to the memory cells that are programmed and a second word line set 916 connected to the memory cells that are not programmed in response to determining the memory cells of the block 900 are not all programmed. The control circuit is additionally configured to apply a delta adjusted read voltage being a default read pass voltage (VREAD) minus a delta (Δ) voltage to a subset of the second word line set 916 separated from the boundary word line 912 in the stack (e.g., stack 610) by at least the offset number of the word lines while reading the particular group of memory cells (those connected to the particular word line 906). The subset of the second word line set 916 may comprise any number of word lines (e.g., two word lines) up to the entire second word line set 916. At the same time, the control circuit can apply the default read pass voltage (VREAD) or the lower read pass voltage (VREADL) to the first word line set 914 in the stack while reading the particular group of memory cells. The offset number of word lines can be two (i.e., WLn+2, the offset being two); however, it should be understood that other offset amounts are contemplated. Furthermore, the delta (Δ) voltage can also be a function of a position of the boundary word line 912.

Referring back to FIG. 5 in addition to FIG. 12A, each of the strings comprises the memory hole (e.g., memory holes 618, 619) extending vertically through the stack and having a plurality of tiers (e.g., the lower tier 908 and an upper tier 910) vertically aligned with one another in the stack and each including a portion of the memory cells. The word lines can, therefore, include a tier periphery word line 922 coupled to one of the plurality of tiers (e.g., lower tier 908) and disposed adjacent to and below another of the plurality of tiers (e.g., upper tier 910) in the stack. In addition, the word lines can include a last word line 924 disposed at a top of the stack and overlaying a remainder of the word lines. According to aspect, the lower tier 908 comprises the first sub-block 902 of the memory cells and the upper tier 910 comprises second sub-block 904 of the memory cells; however, it should be appreciated that the sub-blocks 902, 904 may include more than two sub-blocks 902, 904 and they may be arranged in a different manner other than corresponding to the upper and lower tiers 908, 910.

Referring back to FIG. 4, the memory apparatus 100, 600 can also include the substrate 611 having a major surface extending laterally from (i.e., the x direction) and along a longitudinal axis (i.e., the y direction). The word lines extend along and over the major surface of the substrate longitudinally and alternate with insulating layers between the word lines along the vertical axis (i.e., the z direction) perpendicular to the longitudinal axis to form the stack. For example, either the memory cells connected to the word lines are programmed beginning the lower tier 908 or upper tier 910 closest to the substrate 611 along the vertical axis (e.g., starting with WLL0 for the lower tier 908) and ending with the memory cells furthest from the substrate 611 along the vertical axis. In addition, the lower tier 908 (e.g., the first sub-block 902 of the memory cells) can, for example, be closer to the substrate 611 (along the vertical axis) than the upper tier 910 (e.g., the second sub-block 904 of the memory cells).

Figure 13:
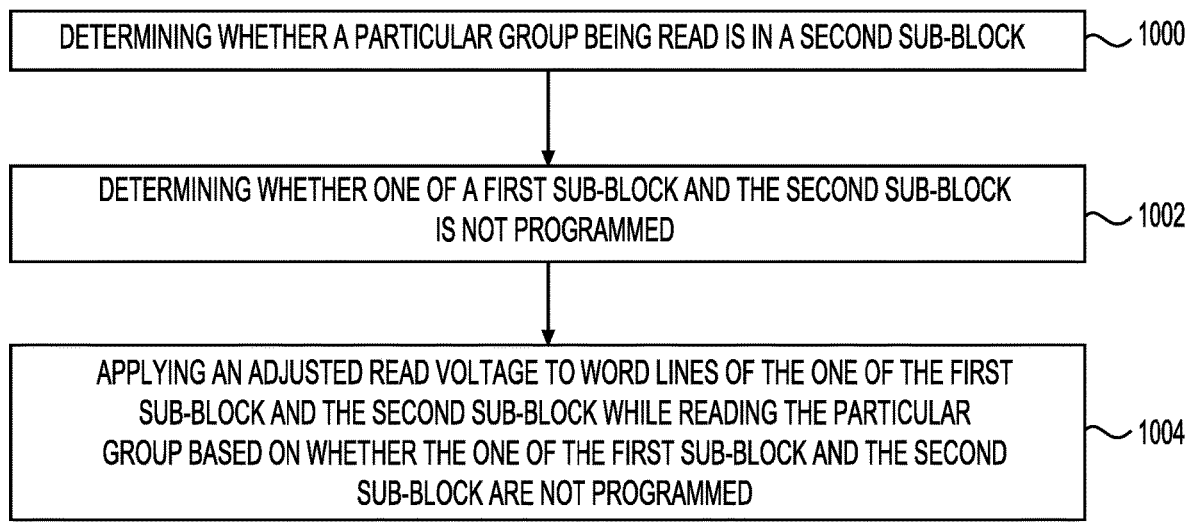
FIGS. 13 and 14 illustrates steps of a method of operating the memory apparatus according to aspects of the disclosure.

Referring to FIG. 13, a method of operating a memory apparatus including a block of memory cells arranged in strings and connected to word lines overlying one another in a stack is also provided. As discussed above, the block 900 can be divided into the first sub-block 902 and the second sub-block 904 configured to be programmed as a whole in a sub-block mode. The block 900 of memory cells also includes the particular group connected to the particular word line 906. The method includes the steps of 1000 determining whether the particular group being read is in the second sub-block 904 in response to the apparatus operating in the sub-block mode and 1002 determining whether one of the first sub-block 902 and the second sub-block 904 is not programmed based on whether the particular group being read is in the second sub-block 904. The method continues by 1004 applying an adjusted read voltage to the word lines of the one of the first sub-block 902 and the second sub-block 904 while reading the particular group based on whether the one of the first sub-block 902 and the second sub-block 904 is not programmed.

Figure 14:
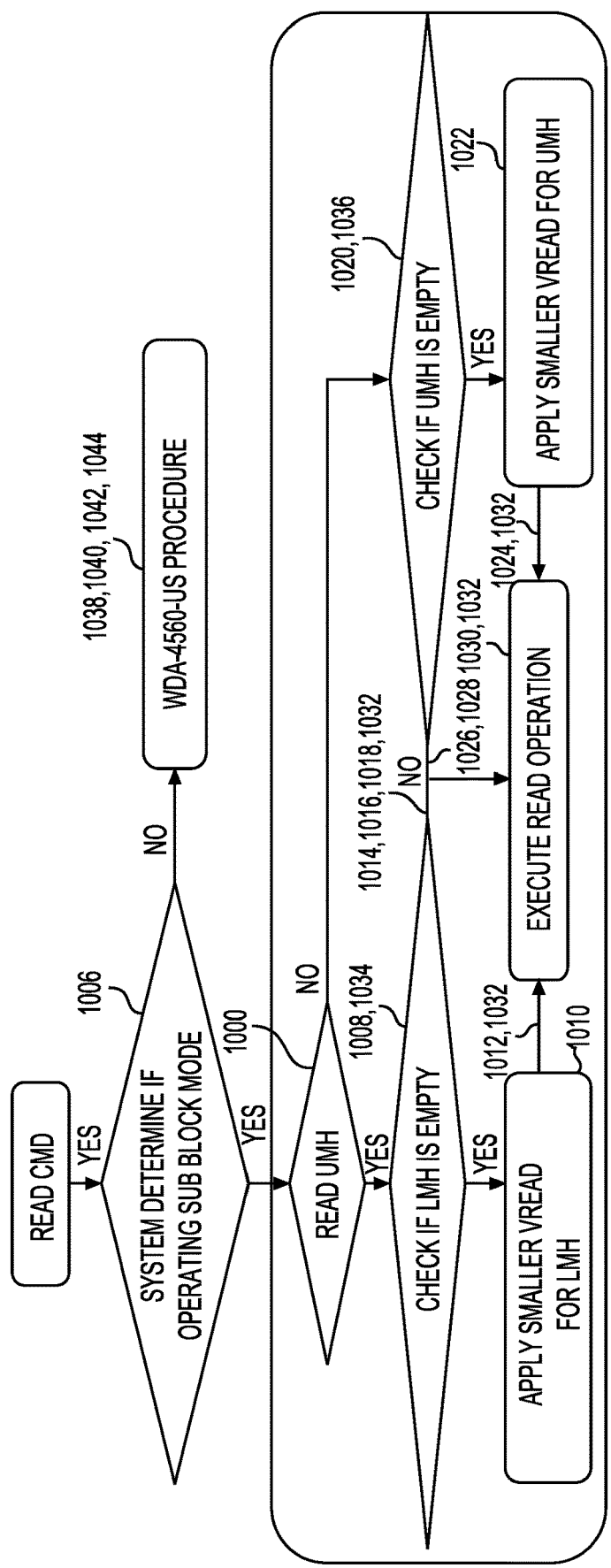

In more detail and as best shown in FIG. 14, the method includes the step of 1006 determining whether the apparatus 100, 600 is operating in the sub-block mode. The method also includes the step of 1008 determining whether the first sub-block 902 of memory cells (e.g., lower tier 908) is not programmed in response determining the particular group being read are in the second sub-block 904 (after the step of 1000 determining whether the particular group being read is in the second sub-block 904 in response to the apparatus operating in the sub-block mode). The method proceeds with the step of 1010 applying the adjusted read voltage to word lines of the first sub-block 902 in response to determining the first sub-block 902 of memory cells is not programmed. The next step of the method is 1012 applying a read voltage (Vcgrv) to the particular word line 906 and a default read pass voltage (VREAD) to the word lines of the second sub-block 904 while reading the particular group of memory cells. The method proceeds by 1014 applying the default read pass voltage (VREAD) to the word lines of the first sub-block 902 in response to determining the first sub-block 902 of memory cells is programmed. Next, 1016 applying the default read pass voltage (VREAD) to the word lines of the second sub-block 904 in response to determining the first sub-block 902 of memory cells is programmed. The next step of the method is 1018 applying the read voltage (Vcgrv) to the particular word line 906 while reading the particular group of memory cells.

The method also includes the step of 1020 determining whether the second sub-block 904 of memory cells is not programmed in response determining the particular group being read is not in the second sub-block 904. The method proceeds with the step of 1022 applying the adjusted read voltage to word lines of the second sub-block 904 in response to determining the second sub-block 904 of memory cells is not programmed. The next step of the method is 1024 applying the read voltage (Vcgrv) to the particular word line 906 and the default read pass voltage (VREAD) to the word lines of the first sub-block 902 while reading the particular group of memory cells. In addition, the method proceeds with the step of 1026 applying the default read pass voltage (VREAD) to the word lines of the second sub-block 904 in response to determining the second sub-block 904 of memory cells is programmed. The method additionally includes the steps of 1028 applying the default read pass voltage to the word lines of the first sub-block 902 in response to determining the second sub-block 904 of memory cells is programmed and 1030 applying the read voltage (Vcgrv) to the particular word line 906 while reading the particular group of memory cells.

As discussed, each of the strings comprises the memory hole (e.g., memory hole 618 or 619 of FIG. 4) extending vertically through the stack and having a plurality of tiers (e.g., lower tier 908 and upper tier 910) vertically aligned with one another in the stack and each including a portion of the memory cells (see e.g., FIGS. 5 and 12A). Again, the word lines include the at least one first neighbor word line 918 adjacent to the particular word line 906 in the stack and the at least one second neighbor word line 920 adjacent to the particular word line 906 in the stack. Thus, the method further includes the step of 1032 applying a neighbor word line voltage being higher than the default read pass voltage to each of the at least one first and second neighbor word lines 918, 920 while reading the particular group of memory cells. In addition, the predetermined first group of the word lines (those word lines for the memory cells of the first sub-block 902—e.g., lower tier 908) can be associated with the first sub-block 902 and the predetermined second group of the word lines (those word lines for the memory cells of the second sub-block 904—e.g., upper tier 910) can be associated with the second sub-block 904. The apparatus 100, 600 includes the logical to physical (L2P) table 913*a* stored in the memory cells (e.g., memory structure 126) and the temporary L2P table 913*b* stored in random access memory (e.g., RAM 122*b*), each configured to store information regarding which blocks 900 and/or sub-blocks 902, 904 of the apparatus 100, 600 are used (i.e., programmed) or empty (i.e., not programmed). Thus, the method includes the step of 1034 determining whether the first sub-block 902 is not programmed using at least one of the L2P table 913*a* and the temporary L2P table 913*b*. The method also includes the step of 1036 determining whether the second sub-block 904 is not programmed using at least one of the L2P table 913*a* and the temporary L2P table 913*b*.

While the method steps above are carried out by the apparatus 100, 600 when operating in the sub-block mode, the following steps may be carried out in response to the apparatus 100,600 not operating in the sub-block mode. Specifically, the method further includes the step of 1038 determining whether the memory cells of the block are all programmed. Next, 1040 determining a boundary word line 912 splitting the word lines into a first word line set 914 connected to the memory cells being programmed and a second word line set 916 connected to the memory cells being not programmed in response to determining the memory cells of the block 900 are not all programmed. The method continues with the step of 1042 applying a read voltage (Vcgrv) to the particular word line 906 while reading the particular group of memory cells. The next step of the method is 1044 applying a delta adjusted read voltage being a default read pass voltage (VREAD) minus a delta voltage to a subset of the word lines connected to the memory cells not being programmed and separated from the boundary word line 912 in the stack by at least an offset number of the word lines while reading the particular group of memory cells.

Referring back to FIG. 8, a threshold voltage of each of the memory cells can be within a common range of threshold voltages defining a plurality of data states associated with threshold voltage distributions. An overdrive voltage is known to be a voltage applied to the word lines of memory cells other than the particular group while reading the particular group of memory cells wherein the memory cells other than the particular group are in a conductive state (e.g., a pass voltage applied to other memory cells of the string to make them conductive when reading the particular group). In more detail, the default read pass voltage is chosen at a level which is sufficiently higher than the highest threshold voltage of a memory cell to ensure that the unselected memory cell is in a conductive or on state. For example, the threshold voltages for states E, A, B and C may be assumed to be −2 V, 0 V, 2 V and 4 V, respectively, and the default read pass voltage, without temperature compensation, may be 6 V. In this case, a storage element in state E is overdriven by 6−(−2)=8 V, a storage element in state A is overdriven by 6−0=6 V, a storage element in state B is overdriven by 6−2=4 V, and a storage element in state C is overdriven by 6−4=2 V. Although the unselected memory cell is in a conductive state in each case, its conductivity will vary based on the extent to which it is overdriven. An unselected memory cell which is more overdriven is more conductive because it has less source-to-drain resistance and more current carrying capability. Similarly, an unselected memory cell which is less overdriven is less conductive because it has more source-to-drain resistance and less current carrying capability. Thus, memory cells which are in the same NAND string as the selected or particular group will have different conductivities based on their programming states even though they are all in a generally conductive state.

Figures 15, 16A, 16B:
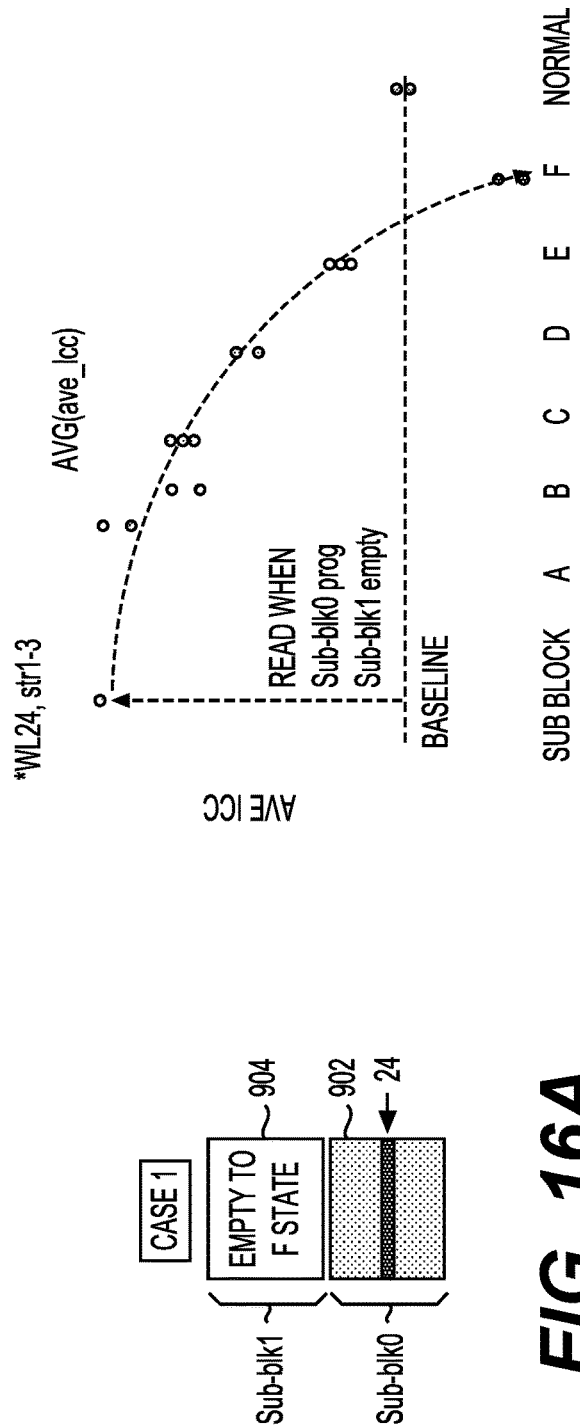
FIG. 15 illustrates example median threshold voltages and corresponding overdrive voltages for each of a plurality of data states according to aspects of the disclosure.
FIG. 16A illustrates the example memory apparatus in a first case in which the first sub-block is programmed and the second sub-block is either empty or programmed to a threshold voltage associated with one of the plurality of data states having median threshold voltages shown in FIG. 15 according to aspects of the disclosure.
FIG. 16B shows an average current draw for each data state plotted versus the data state for first case according to aspects of the disclosure.
Figure 17A:
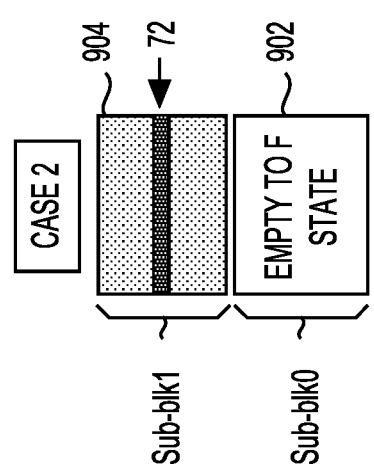
FIG. 17A illustrates the example memory apparatus in a second case in which the second sub-block is programmed and the first sub-block is either empty or programmed to a threshold voltage associated with one of the plurality of data states having median threshold voltages shown in FIG. 15 according to aspects of the disclosure.
Figure 17B:
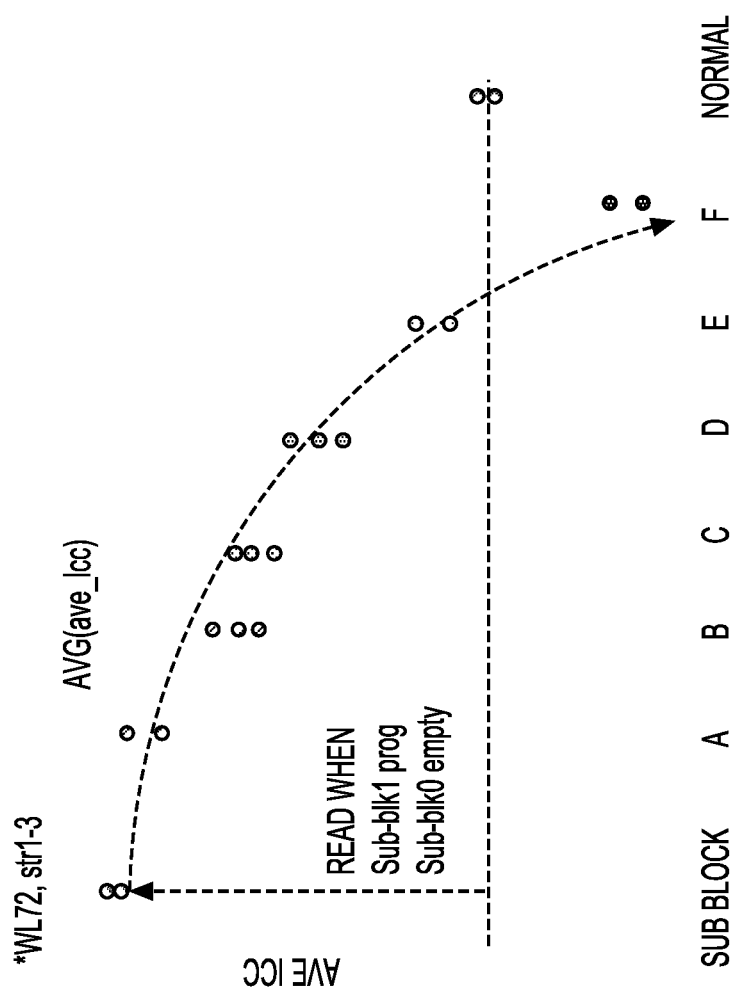
FIG. 17B shows an average current draw for each data state plotted versus the data state for second case according to aspects of the disclosure.

FIG. 15 illustrates example median threshold voltages and corresponding overdrive voltages for each data state. For the example apparatus 100, 600, a first case (case 1) is illustrated in FIG. 16A in which the first sub-block 902 is programmed and the second sub-block 904 is either empty (not programmed) or programmed to a threshold voltage associated with one of the data states (A, B, C, D, E, F) having median threshold voltages shown in FIG. 15. An average current draw for each data state is plotted versus the data state for first case in FIG. 16B utilizing the overdrive for each of the data states to emulate the applied VREAD for the empty sub-block 904. Similarly, for the example apparatus 100, 600, a second case (case 2) is illustrated in FIG. 17A in which the second sub-block 902 is programmed and the first sub-block 902 is either empty (not programmed) or programmed to a threshold voltage associated with one of the data states (A, B, C, D, E, F) having median threshold voltages shown in FIG. 15. The average current draw for each data state is plotted versus the data state for first case in FIG. 17B utilizing the overdrive for each of the data states to emulate the applied VREAD for the empty sub-block 902. In the example apparatus 100, 600, emulation results show that the adjusted read voltage can be selected as approximately 3.6V (between the overdrive voltages for the E and F states). Specifically, the adjusted read voltage of approximately 3.6V for the empty tier 908, 910 (first and second sub-blocks 902, 904) can achieve a similar level of average current draw compared to the closed block condition (when both sub-blocks 902, 904 are programmed and not empty) So, the control circuit (e.g., control circuitry 110 and the controller 122) is further configured to select the adjusted read voltage (i.e., smaller VREAD) based on a predetermined overdrive voltage chosen according to the plurality of data states.

Figure 18B:
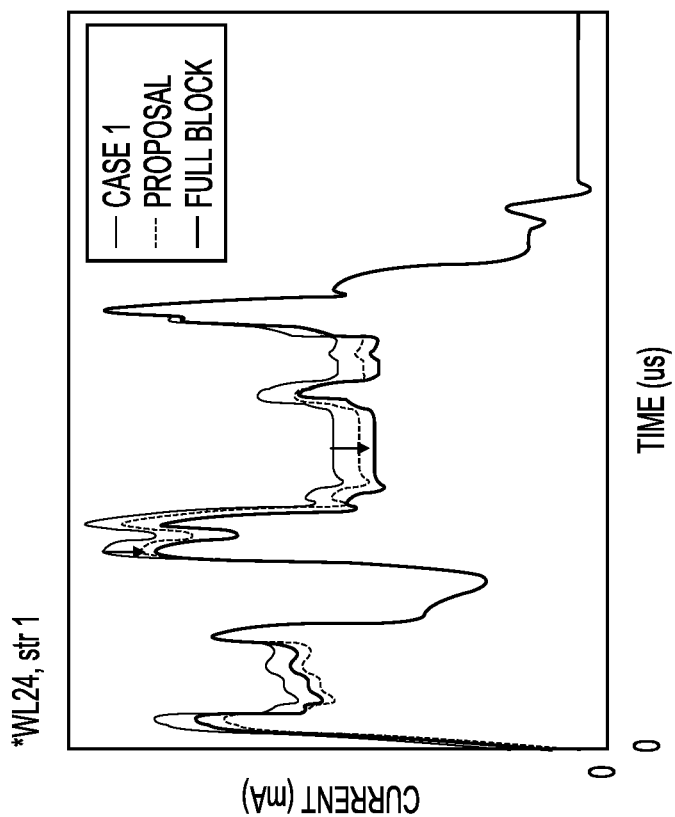
FIG. 18B shows a current draw over time for a read of a specific word line in the first sub-block for the first case according to aspects of the disclosure.
Figure 18A:
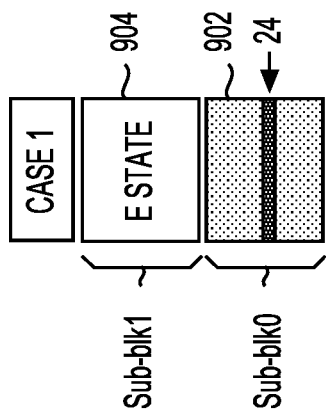
FIG. 18A illustrates the example memory apparatus in a first case in which the first sub-block is programmed and the second sub-block is programmed to the E data state according to aspects of the disclosure.
Figure 19B:
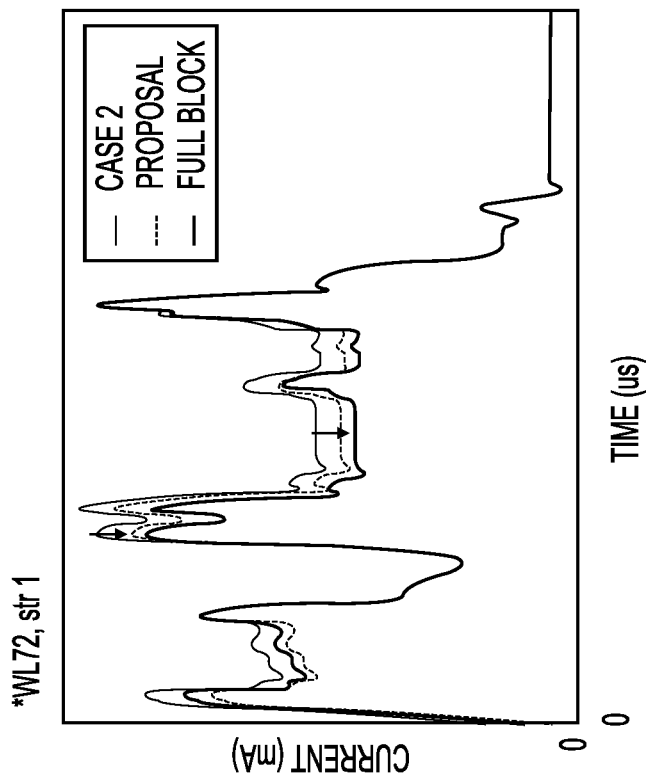
FIG. 19B shows a current draw over time for a read of a specific word line in the second sub-block for the second case according to aspects of the disclosure.
Figure 19A:
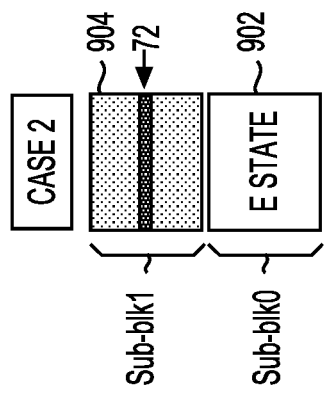
FIG. 19A illustrates the example memory apparatus in a second case in which the second sub-block is programmed and the first sub-block is programmed to the E data state according to aspects of the disclosure.

FIG. 18A illustrates a first case (case 1) in which the first sub-block 902 is programmed and the second sub-block 904 is programmed to the E data state (instead of being empty). FIG. 18B shows the current draw over time for a read of a specific word line (WL24) in the first sub-block 902 for the first case. FIG. 19A illustrates a second case (case 2) in which the second sub-block 904 is programmed and the first sub-block 902 is programmed to the E data state (instead of being empty). FIG. 19B shows the current draw over time for a read of a specific word line (WL72) in the second sub-block 904 for the second case. In other words, the E data state is programmed on empty tiers 908, 910 to simulate the application of the adjusted read voltage to the empty sub-blocks 902, 904 when reading word lines of programmed sub-blocks 902, 904. As shown, the application of the adjusted read voltage to the empty sub-blocks 902, 904 when reading word lines of programmed sub-blocks 902, 904 reduces VREAD overdrive on memory hole channel and therefore effectively reduces average and peak current draw to be comparable to the full block condition after the bitline ramps up (e.g., after R4 clock).

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
a block of memory cells arranged in strings and connected to word lines overlying one another in a stack, the block divided into a first sub-block and a second sub-block configured to be programmed as a whole in a sub-block mode and includes a particular group connected to a particular word line; and
a control circuit coupled to the word lines and configured to:
determine whether the particular group being read are in the second sub-block in response to the apparatus operating in the sub-block mode,
determine whether one of the first sub-block and the second sub-block is not programmed based on whether the particular group being read are in the second sub-block, and
apply an adjusted read voltage to the word lines of the one of the first sub-block and the second sub-block while reading the particular group based on whether the one of the first sub-block and the second sub-block is not programmed.

2. The apparatus as set forth in claim 1, wherein each of the strings comprises a memory hole extending vertically through the stack and having a plurality of tiers including a lower tier and an upper tier vertically aligned with one another in the stack and the lower tier comprises the first sub-block of the memory cells and the upper tier comprises second sub-block of the memory cells.

3. The apparatus as set forth in claim 1, wherein the control circuit is further configured to:
determine whether the first sub-block of memory cells is not programmed in response determining the particular group being read are in the second sub-block,
apply the adjusted read voltage to word lines of the first sub-block in response to determining the first sub-block of memory cells is not programmed,
apply a read voltage to the particular word line and a default read pass voltage to the word lines of the second sub-block while reading the particular group of memory cells,
apply the default read pass voltage to the word lines of the first sub-block in response to determining the first sub-block of memory cells is programmed,
apply the default read pass voltage to the word lines of the second sub-block in response to determining the first sub-block of memory cells is programmed,
apply the read voltage to the particular word line while reading the particular group of memory cells,
determine whether the second sub-block of memory cells is not programmed in response determining the particular group being read is not in the second sub-block,
apply the adjusted read voltage to word lines of the second sub-block in response to determining the second sub-block of memory cells is not programmed,
apply the read voltage to the particular word line and the default read pass voltage to the word lines of the first sub-block while reading the particular group of memory cells,
apply the default read pass voltage to the word lines of the second sub-block in response to determining the second sub-block of memory cells is programmed,
apply the default read pass voltage to the word lines of the first sub-block in response to determining the second sub-block of memory cells is programmed, and
apply the read voltage to the particular word line while reading the particular group of memory cells.

4. The apparatus as set forth in claim 3, wherein the word lines include at least one first neighbor word line adjacent to the particular word line in the stack and at least one second neighbor word line adjacent to the particular word line in the stack, the control circuit further configured to apply a neighbor word line voltage being higher than the default read pass voltage to each of the at least one first and second neighbor word lines while reading the particular group of memory cells.

5. The apparatus as set forth in claim 3, wherein the adjusted read voltage is less than the default read pass voltage.

6. The apparatus as set forth in claim 1, further including a logical to physical table stored in the memory cells and a random access memory storing a temporary logical to physical table, the logical to physical table and temporary logical to physical table configured to store information regarding which of the first sub-block and the second sub-block is programmed or not programmed and the control circuit is further configured to:
determine whether the first sub-block is not programmed using at least one of the logical to physical table and the temporary logical to physical table, and
determine whether the first sub-block is not programmed using at least one of the logical to physical table and the temporary logical to physical table.

7. The apparatus as set forth in claim 1, wherein the word lines include at least one first neighbor word line adjacent to the particular word line in the stack and at least one second neighbor word line adjacent to the particular word line in the stack, in response to the apparatus not operating in the sub-block mode, the control circuit is configured to:
determine whether the memory cells of the block are all programmed,
determine a boundary word line splitting the word lines into a first word line set connected to the memory cells being programmed and a second word line set connected to the memory cells being not programmed in response to determining the memory cells of the block are not all programmed,
apply a read voltage to the particular word line while reading the particular group of memory cells, and
apply a delta adjusted read voltage being a default read pass voltage minus a delta voltage to a subset of the word lines connected to the memory cells not being programmed and separated from the boundary word line in the stack by at least an offset number of the word lines while reading the particular group of memory cells.

8. The apparatus as set forth in claim 1, wherein a threshold voltage of each of the memory cells is within a common range of threshold voltages defining a plurality of data states associated with threshold voltage distributions and the control circuit is further configured to select the adjusted read voltage based on a predetermined overdrive voltage chosen according to the plurality of data states, the predetermined overdrive voltage being a voltage applied to the word lines of memory cells other than the particular group while reading the particular group of memory cells wherein the memory cells other than the particular group are in a conductive state.

9. A controller in communication with a block of memory cells of a memory apparatus arranged in strings and connected to word lines overlying one another in a stack, the block divided into a first sub-block and a second sub-block configured to be programmed as a whole in a sub-block mode and includes a particular group connected to a particular word line, the controller configured to:
determine whether the particular group being read are in the second sub-block in response to the apparatus operating in the sub-block mode;
instruct the memory apparatus to determine whether one of the first sub-block and the second sub-block is not programmed based on whether the particular group being read are in the second sub-block; and
instruct the memory apparatus to apply an adjusted read voltage to the word lines of the one of the first sub-block and the second sub-block while reading the particular group based on whether the one of the first sub-block and the second sub-block is not programmed.

10. The controller as set forth in claim 9, wherein each of the strings comprises a memory hole extending vertically through the stack and having a plurality of tiers including a lower tier and an upper tier vertically aligned with one another in the stack and the lower tier comprises the first sub-block of the memory cells and the upper tier comprises second sub-block of the memory cells.

11. The controller as set forth in claim 9, wherein the controller is further configured to:
determine whether the first sub-block of memory cells is not programmed in response determining the particular group being read are in the second sub-block,
instruct the memory apparatus to apply the adjusted read voltage to word lines of the first sub-block in response to determining the first sub-block of memory cells is not programmed,
instruct the memory apparatus to apply a read voltage to the particular word line and a default read pass voltage to the word lines of the second sub-block while reading the particular group of memory cells,
instruct the memory apparatus to apply the default read pass voltage to the word lines of the first sub-block in response to determining the first sub-block of memory cells is programmed,
instruct the memory apparatus to apply the default read pass voltage to the word lines of the first sub-block in response to determining the first sub-block of memory cells is programmed,
instruct the memory apparatus to apply the read voltage to the particular word line while reading the particular group of memory cells,
determine whether the second sub-block of memory cells is not programmed in response determining the particular group being read is not in the second sub-block,
instruct the memory apparatus to apply the adjusted read voltage to word lines of the second sub-block in response to determining the second sub-block of memory cells is not programmed,
instruct the memory apparatus to apply the read voltage to the particular word line and the default read pass voltage to the word lines of the first sub-block while reading the particular group of memory cells,
instruct the memory apparatus to apply the default read pass voltage to the word lines of the second sub-block in response to determining the second sub-block of memory cells is programmed,
instruct the memory apparatus to apply the default read pass voltage to the word lines of the second sub-block in response to determining the second sub-block of memory cells is programmed, and
instruct the memory apparatus to apply the read voltage to the particular word line while reading the particular group of memory cells.

12. The controller as set forth in claim 11, wherein the word lines include at least one first neighbor word line adjacent to the particular word line in the stack and at least one second neighbor word line adjacent to the particular word line in the stack, the controller is further configured to instruct the memory apparatus to apply a neighbor word line voltage being higher than the default read pass voltage to each of the at least one first and second neighbor word lines while reading the particular group of memory cells.

13. The controller as set forth in claim 9, wherein the memory apparatus further includes a logical to physical table stored in the memory cells and the controller includes a random access memory storing a temporary logical to physical table, the logical to physical table and temporary logical to physical table configured to store information regarding which of the first sub-block and the second sub-block is programmed or not programmed and the controller is further configured to:
determine whether the first sub-block is not programmed using at least one of the logical to physical table and the temporary logical to physical table, and
determine whether the first sub-block is not programmed using at least one of the logical to physical table and the temporary logical to physical table.

14. The controller as set forth in claim 9, wherein the word lines include at least one first neighbor word line adjacent to the particular word line in the stack and at least one second neighbor word line adjacent to the particular word line in the stack, in response to the apparatus not operating in the sub-block mode, the controller is configured to:
determine whether the memory cells of the block are all programmed,
determine a boundary word line splitting the word lines into a first word line set connected to the memory cells being programmed and a second word line set connected to the memory cells being not programmed in response to determining the memory cells of the block are not all programmed,
instruct the memory apparatus to apply a read voltage to the particular word line while reading the particular group of memory cells, and
instruct the memory apparatus to apply a delta adjusted read voltage being a default read pass voltage minus a delta voltage to a subset of the word lines connected to the memory cells not being programmed and separated from the boundary word line in the stack by at least an offset number of the word lines while reading the particular group of memory cells.

15. A method of operating a memory apparatus including a block of memory cells arranged in strings and connected to word lines overlying one another in a stack, the block divided into a first sub-block and a second sub-block configured to be programmed as a whole in a sub-block mode and includes a particular group connected to a particular word line, the method comprising the steps of:
determining whether the particular group being read are in the second sub-block in response to the apparatus operating in the sub-block mode;
determining whether one of the first sub-block and the second sub-block is not programmed based on whether the particular group being read are in the second sub-block; and
applying an adjusted read voltage to the word lines of the one of the first sub-block and the second sub-block while reading the particular group based on whether the one of the first sub-block and the second sub-block is not programmed.

16. The method as set forth in claim 15, wherein each of the strings comprises a memory hole extending vertically through the stack and having a plurality of tiers including a lower tier and an upper tier vertically aligned with one another in the stack and the lower tier comprises the first sub-block of the memory cells and the upper tier comprises second sub-block of the memory cells.

17. The method as set forth in claim 15, further including the steps of:
    determining whether the first sub-block of memory cells is not programmed in response determining the particular group being read are in the second sub-block;
    applying the adjusted read voltage to word lines of the first sub-block in response to determining the first sub-block of memory cells is not programmed;
    applying a read voltage to the particular word line and a default read pass voltage to the word lines of the second sub-block while reading the particular group of memory cells;
    applying the default read pass voltage to the word lines of the first sub-block in response to determining the first sub-block of memory cells is programmed;
    applying the default read pass voltage to the word lines of the first sub-block in response to determining the first sub-block of memory cells is programmed;
    applying the read voltage to the particular word line while reading the particular group of memory cells;
    determining whether the second sub-block of memory cells is not programmed in response determining the particular group being read is not in the second sub-block;
    applying the adjusted read voltage to word lines of the second sub-block in response to determining the second sub-block of memory cells is not programmed;
    applying the read voltage to the particular word line and the default read pass voltage to the word lines of the first sub-block while reading the particular group of memory cells;
    applying the default read pass voltage to the word lines of the second sub-block in response to determining the second sub-block of memory cells is programmed;
    applying the default read pass voltage to the word lines of the first sub-block in response to determining the second sub-block of memory cells is programmed; and
    applying the read voltage to the particular word line while reading the particular group of memory cells.

18. The method as set forth in claim 17, wherein the word lines include at least one first neighbor word line adjacent to the particular word line in the stack and at least one second neighbor word line adjacent to the particular word line in the stack, the method further including the step of applying a neighbor word line voltage being higher than the default read pass voltage to each of the at least one first and second neighbor word lines while reading the particular group of memory cells.

19. The method as set forth in claim 15, wherein the memory apparatus further includes a logical to physical table stored in the memory cells and a random access memory storing a temporary logical to physical table, the logical to physical table and temporary logical to physical table configured to store information regarding which of the first sub-block and the second sub-block is programmed or not programmed, the method further including the steps of:
    determining whether the first sub-block is not programmed using at least one of the logical to physical table and the temporary logical to physical table, and
    determining whether the first sub-block is not programmed using at least one of the logical to physical table and the temporary logical to physical table.

20. The method as set forth in claim 15, wherein the word lines include at least one first neighbor word line adjacent to the particular word line in the stack and at least one second neighbor word line adjacent to the particular word line in the stack, in response to the apparatus not operating in the sub-block mode, the method further including the steps of:
    determining whether the memory cells of the block are all programmed;
    determining a boundary word line splitting the word lines into a first word line set connected to the memory cells being programmed and a second word line set connected to the memory cells being not programmed in response to determining the memory cells of the block are not all programmed;
    applying a read voltage to the particular word line while reading the particular group of memory cells; and
    applying a delta adjusted read voltage being a default read pass voltage minus a delta voltage to a subset of the word lines connected to the memory cells not being programmed and separated from the boundary word line in the stack by at least an offset number of the word lines while reading the particular group of memory cells.

* * * * *